United States Patent
Furutani et al.

(10) Patent No.: US 10,098,243 B2
(45) Date of Patent: Oct. 9, 2018

(54) PRINTED WIRING BOARD AND SEMICONDUCTOR PACKAGE

(71) Applicant: IBIDEN CO., LTD., Ogaki-shi (JP)

(72) Inventors: Toshiki Furutani, Ogaki (JP); Yuki Yoshikawa, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 145 days.

(21) Appl. No.: 14/857,074

(22) Filed: Sep. 17, 2015

(65) Prior Publication Data
US 2016/0088727 A1    Mar. 24, 2016

(30) Foreign Application Priority Data

Sep. 19, 2014    (JP) .................................. 2014-191277

(51) Int. Cl.
*H05K 1/14* (2006.01)
*H05K 3/46* (2006.01)
(Continued)

(52) U.S. Cl.
CPC .. *H05K 3/4673* (2013.01); *H01L 2224/16225* (2013.01); *H01L 2224/48091* (2013.01); *H01L 2224/48227* (2013.01); *H05K 1/0271* (2013.01); *H05K 3/3436* (2013.01); *H05K 2201/096* (2013.01); *H05K 2201/09827* (2013.01)

(58) Field of Classification Search
CPC ....... H01L 2224/16225; H01L 2224/16; H01L 2224/16227; H01L 2224/48091; H01L 2201/093; H01L 2201/10734; H01L 2924/01078–2924/01079; H05K 1/115; H05K 1/185; H05K 1/0271; H05K 1/0298; H05K 3/4644; H05K 3/4697; H05K 1/111; H05K 1/162; H05K 1/181–1/182
USPC ................. 174/255, 258–264; 361/760–767, 361/792–795; 257/720–730
See application file for complete search history.

(56) References Cited

U.S. PATENT DOCUMENTS 7,358,445 B1 * 4/2008 Mohri .................... H05K 3/207
174/255
7,507,913 B2 * 3/2009 Inagaki ............. H01L 23/49816
174/260
(Continued)

FOREIGN PATENT DOCUMENTS

JP    2000-349435 A    12/2000

*Primary Examiner* — Tuan T Dinh
(74) *Attorney, Agent, or Firm* — Oblon, McClelland, Maier & Neustadt, L.L.P.

(57) ABSTRACT

A printed wiring board includes a core laminate body including insulating layers, conductor layers including first and second conductor layers, and via conductors having smaller end surfaces connected to the first conductor layer, a first build-up layer formed on the core body and including an interlayer, a conductor layer on the interlayer, and via conductors having smaller end surfaces connected to the first conductor layer, and a second build-up layer formed on the core body and including an interlayer and a conductor layer on the interlayer. The first conductor layer is embedded such that the first conductor layer has exposed surface on the surface of the core body, the second conductor layer is formed on the other surface of the core body, and the first conductor layer has wiring pattern having the smallest minimum width of wiring patterns of the conductor layers in the core body and build-up layers.

20 Claims, 11 Drawing Sheets

(51) Int. Cl.
*H05K 1/02* (2006.01)
*H05K 3/34* (2006.01)

(56) References Cited

U.S. PATENT DOCUMENTS

| | | | | |
|---|---|---|---|---|
| 7,989,707 B2* | 8/2011 | Yamano | ............... | H01L 24/83 |
| | | | | 174/260 |
| 8,110,749 B2* | 2/2012 | Yoshimura | ............ | H05K 3/445 |
| | | | | 174/260 |
| 2012/0234589 A1* | 9/2012 | Furuichi | ............ | H05K 3/4682 |
| | | | | 174/261 |
| 2013/0081870 A1* | 4/2013 | Furutani | ............ | H05K 3/445 |
| | | | | 174/262 |
| 2013/0192884 A1* | 8/2013 | Furutani | ............ | H05K 1/185 |
| | | | | 174/258 |
| 2014/0290997 A1* | 10/2014 | Maeda | ............ | H05K 3/4673 |
| | | | | 174/258 |

* cited by examiner

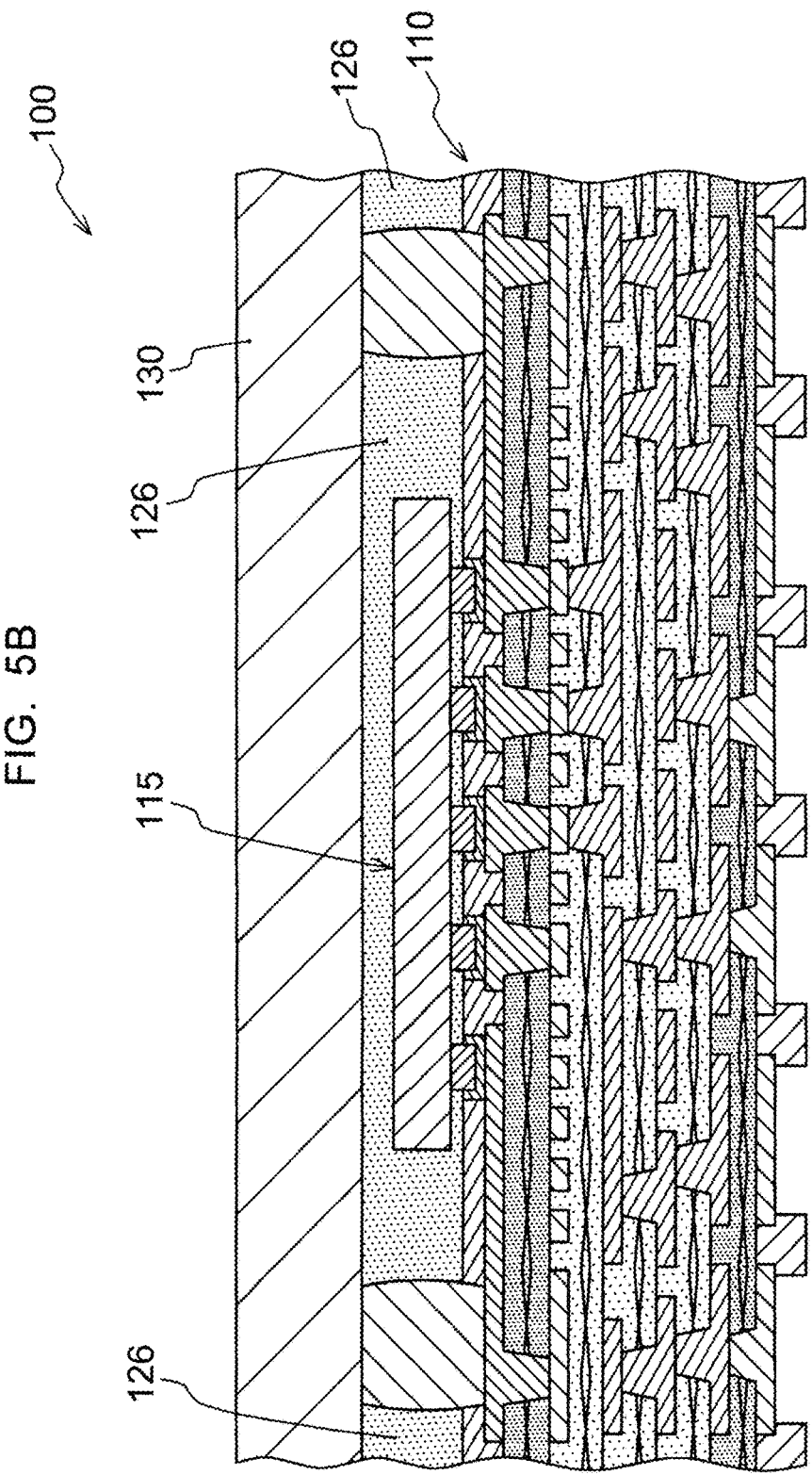

PRINTED WIRING BOARD AND SEMICONDUCTOR PACKAGE

CROSS-REFERENCE TO RELATED APPLICATIONS

The present application is based upon and claims the benefit of priority to Japanese Patent Application No. 2014-191277, filed Sep. 19, 2014, the entire contents of which are incorporated herein by reference.

BACKGROUND OF THE INVENTION

Field of the Invention

The present invention relates to a printed wiring board and a semiconductor package.

Description of Background Art

A build-up wiring board may be formed, for example, by laminating a build-up layer that includes a conductor layer and an insulating layer on a surface on each of two sides of a core substrate that includes conductor layers and two insulating layers. Further, a solder resist may be formed on a predetermined portion of the build-up layer (for example, see Japanese Patent Laid-Open Publication No. 2000-349435). The entire contents of this publication are incorporated herein by reference.

SUMMARY OF THE INVENTION

According to one aspect of the present invention, a printed wiring board includes a core laminate body including insulating layers, conductor layers including a first conductor layer and a second conductor layer, and via conductors having smaller end surfaces connected to the first conductor layer, a first build-up layer formed on a first surface of the core laminate body and including a first interlayer resin insulating layer, a third conductor layer laminated on the first interlayer resin insulating layer, and first via conductors having smaller end surfaces connected to the first conductor layer of the core laminate body, and a second build-up layer formed on a second surface of the core laminate body and including a second interlayer resin insulating layer and a fourth conductor layer laminated on the second interlayer resin insulating layer. The first conductor layer is embedded such that the first conductor layer has an exposed surface on the first surface of the core laminate body, the second conductor layer is formed such that the second conductor layer is on the second surface of the core laminate body, and the first conductor layer has a wiring pattern having the minimum width which is the smallest of the minimum widths of wiring patterns of the conductor layers formed in the core laminate body and the third conductor layer in the first build-up layer and the fourth conductor layer in the second build-up layer.

According to another aspect of the present invention, a semiconductor package includes a printed wiring board, a first semiconductor component mounted on a surface of the printed wiring board, and a substrate mounted on the surface of the printed wiring board and having a bump structure such that the substrate is positioned on the printed wring board through the bump structure. The printed wiring board includes a core laminate body including insulating layers, conductor layers including a first conductor layer and a second conductor layer, and via conductors having smaller end surfaces connected to the first conductor layer, a first build-up layer formed on a first surface of the core laminate body and including a first interlayer resin insulating layer, a third conductor layer laminated on the first interlayer resin insulating layer, and first via conductors having smaller end surfaces connected to the first conductor layer of the core laminate body, a second build-up layer formed on a second surface of the core laminate body and including a second interlayer resin insulating layer and a fourth conductor layer laminated on the second interlayer resin insulating layer, and a solder resist layer formed on a surface of the first build-up layer and having an opening structure such that the bump structure is connected to an outermost conductor layer of the first build-up layer through the opening structure, the first conductor layer is embedded such that the first conductor layer has an exposed surface on the first surface of the core laminate body, the second conductor layer is formed such that the second conductor layer is on the second surface of the core laminate body, and the first conductor layer has a wiring pattern having the minimum width which is the smallest of the minimum widths of wiring patterns of the conductor layers formed in the core laminate body and the third conductor layer in the first build-up layer and the fourth conductor layer in the second build-up layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5B is a cross-sectional view of another example of a semiconductor package according to an embodiment of the present invention;

DETAILED DESCRIPTION OF THE EMBODIMENTS

Figure 1:
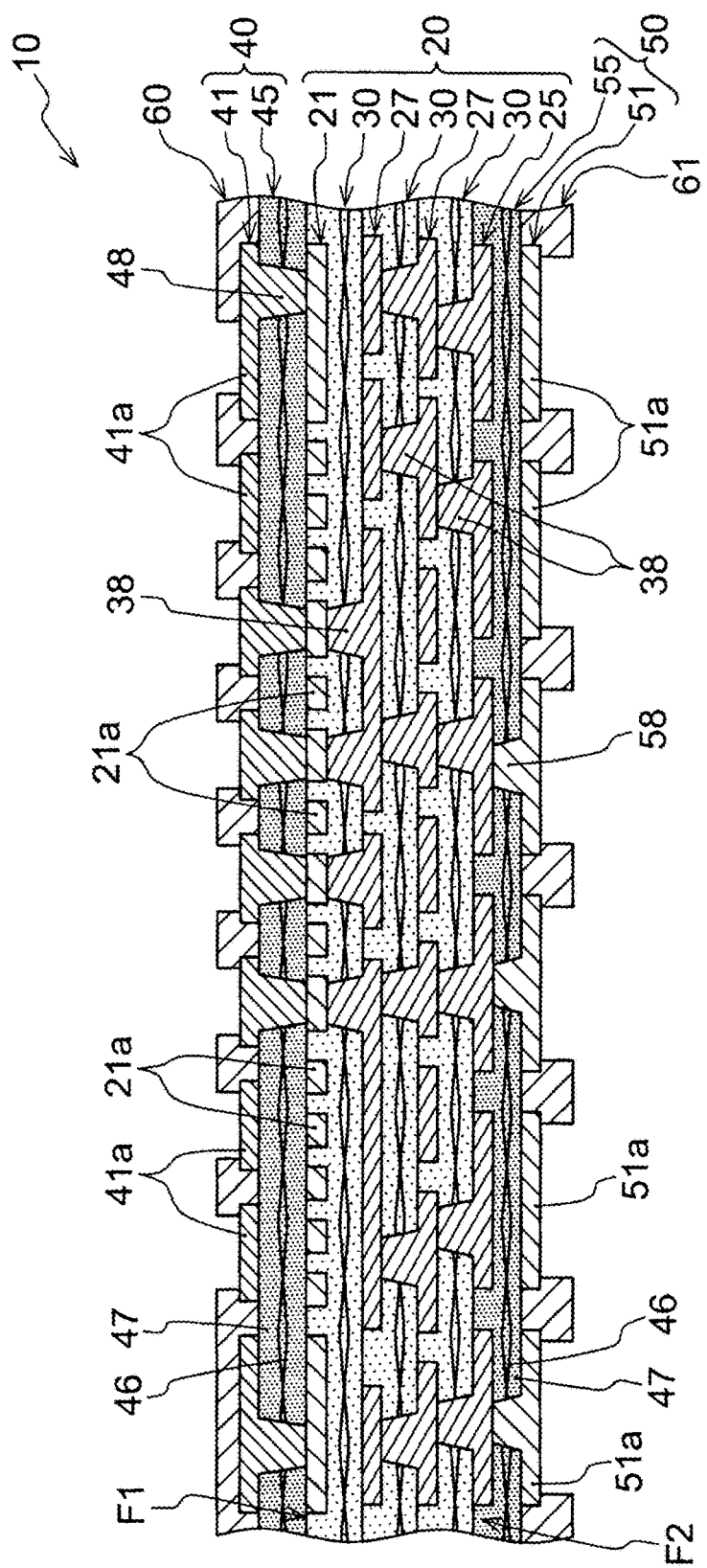
FIG. 1 is a cross-sectional view of a printed wiring board according to an embodiment of the present invention.

The embodiments will now be described with reference to the accompanying drawings, wherein like reference numerals designate corresponding or identical elements throughout the various drawings.

A printed wiring board according to an embodiment of the present invention is described with reference to the drawings. As illustrated in FIG. 1, a printed wiring board 10 (hereinafter, the printed wiring board is also simply referred to as a wiring board) of an embodiment of the present invention includes: a core laminate body 20 that has a first conductor layer 21 on a first surface (F1) and a second conductor layer 25 on a second surface (F2) that is on an opposite side of the first surface (F1); a first build-up layer 40 that is provided on the first surface (F1) of the core laminate body 20 and includes at least a first interlayer resin insulating layer 45 and a third conductor layer 41 that is laminated on the first interlayer resin insulating layer 45 (in the present embodiment, includes the first interlayer resin insulating layer 45 and the third conductor layer 41); and a second build-up layer 50 that is provided on the second surface (F2) of the core laminate body 20 and includes at least a second interlayer resin insulating layer 55 and a fourth conductor layer 51 that is laminated on the second interlayer resin insulating layer 55 (in the present embodiment, includes the second interlayer resin insulating layer 55 and the fourth conductor layer 51). Further, in the example illustrated in FIG. 1, the wiring board 10 includes via conductors 38 that penetrate through insulating layers 30 in the core laminate body 20 and via conductors (48, 58) that respectively penetrate through the first and second interlayer resin insulating layers (45, 55) in the first and second build-up layers (40, 50). The via conductors (38, 48, 58) are respectively connected to one or two of conductor layers (that is, the first conductor layer 21, the second conductor layer 25, and inner-layer conductor layers 27) in the core laminate body 20, and conductor layers (that is, the third conductor layer 41 and the fourth conductor layer 51) in the first and second build-up layers (40, 50).

Figure 2A:
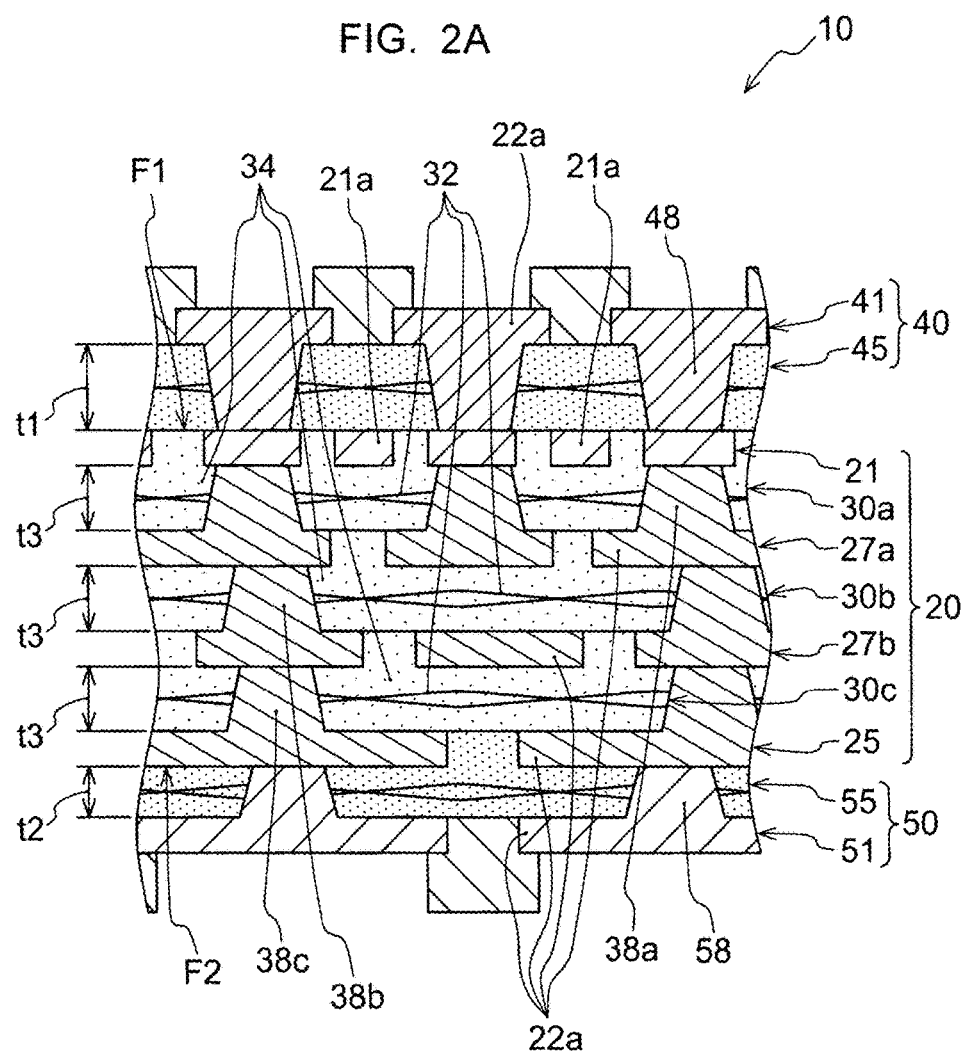
FIG. 2A is an enlarged view of a central portion of the wiring board illustrated in FIG. 1.

In the present embodiment, the via conductors 48 are formed on one surface (a surface on the first build-up layer 40 side in the example illustrated in FIG. 1) of the first conductor layer 21 so as to be in contact with the one surface, an end surface of each via conductor 48 on the one surface side being smaller than an end surface of the via conductor 48 on an opposite side (an end surface on the third conductor layer 41 side in the example illustrated in FIG. 1). Similarly, the via conductors 38 are formed on the other surface (a surface on the second build-up layer 50 side in the example illustrated in FIG. 1) of the first conductor layer 21 so as to be in contact with the other surface, an end surface of each via conductor 38 on the other surface side being smaller than an end surface of the via conductor 38 on an opposite side (an end surface on the conductor layer 27 side in the example illustrated in FIG. 1). In other words, the first conductor layer 21 of the wiring board 10 of the present embodiment is a conductor layer on one surface and the other surface of which via conductors (the via conductors (48, 38) in the example illustrated in FIG. 1) each having end surfaces of different sizes on the one surface side and the other surface side are respectively formed such that the smaller end surface is in contact with the one surface or the other surface. In the example illustrated in FIG. 1, the via conductors 48 and via conductors 38, which are formed so as to be in contact with the one surface or the other surface of the first conductor layer 21, are respectively tapered toward the first conductor layer 21 side and, in FIG. 1, each have a shape that is gradually reduced in width toward the first conductor layer 21 side. As illustrated in FIG. 2A, in the wiring board 10 of the present embodiment, the second conductor layer 25 is formed on an insulating layer (30c) of the second surface (F2) of the core laminate body 20, whereas the first conductor layer 21 is embedded in an insulating layer (30a) of the first surface (F1) of the core laminate body 20 while one surface of the first conductor layer 21 on the first build-up layer 40 side is exposed from the insulating layer (30a). In the following description, when a relative positional relation in a thickness direction of the wiring board 10 is indicated, unless otherwise indicated, a farther side from a central portion of the core laminate body 20 (from an insulating layer (30b) in the example illustrated in FIG. 2A) is referred to as an "upper side" or an "outer side" and a closer side is referred to as a "lower side" or an "inner side." Further, according to this definition, a surface positioned on an "upper side" is referred to as an "upper surface" and a surface positioned on a "lower side" is referred to as a "lower surface."

In the present embodiment, a minimum width of a wiring pattern (21a) that is formed in the first conductor layer 21 is the smallest among minimum widths of wiring patterns that are respectively formed in the conductor layers (the first conductor layer 21, the second conductor layer 25 and inner-layer conductor layers (27a, 27b) in the present embodiment) that form the core laminate body 20, the conductor layer (third conductor layer 41 in the present embodiment) that forms the first build-up layer 40 and the conductor layer (the fourth conductor layer 51 in the present embodiment) that forms the second build-up layer 50. That is, the wiring pattern (21a) that is formed in the first conductor layer 21 is formed such that the minimum width of the wiring pattern (21a) is smaller than minimum widths of all wiring patterns (22a) that are respectively formed in other conductor layers in the wiring board 10.

An electronic component, such as a semiconductor element or multiple passive components, may be mounted on a surface-layer conductor layer of a printed wiring board. A wiring pattern that is connected to such an electronic component is formed as short as possible so as to obtain good electrical characteristics and thus is preferably formed on surface-layer conductor layer. Therefore, a build-up method is adopted to form a surface-layer portion when necessary, so as to allow a wiring pattern to be formed at a high density in a surface-layer conductor layer. However, a large number of connection pads for an electronic component are formed in the surface-layer conductor layer. Therefore, a region where a wiring pattern that is to be connected to the electronic component can be formed is relatively small.

Therefore, there is a tendency that wiring patterns are formed in a conductor layer immediately below a surface-layer conductor layer rather than in the surface-layer conductor layer, or in a conductor layer that is relatively close to the surface-layer conductor layer among conductor layers of further lower layers. Along with progress in mulitpolarization of an electronic component mounted on a printed wiring board, the number of wiring patterns that are to be connected to the electronic component is increased. Along with this, the formation of the wiring patterns concentrates in conductor layers near the surface-layer conductor layer and it is possible that the number of the conductor layers required for the formation of the wiring patterns is increased. As a result, a wiring length of a wiring pattern connecting between electronic components becomes long, such as in a case where electronic components and the like are connected via a conductor layer that is distanced from a surface layer of a printed wiring board, and it is possible that good electrical characteristics cannot be obtained and manufacturing cost of the printed wiring board is increased.

In the wiring board 10 of the present embodiment, the core laminate body 20 has the first conductor layer 21 on the first surface (F1); the first build-up layer 40 is provided on the first surface (F1); and the wiring pattern (21a) of the first conductor layer 21 is formed so as to have the minimum wiring width among the wiring patterns of the conductor layers that respectively form the core laminate body 20 and the first and second build-up layers (40, 50). Therefore, for example, in a case where a multipolar electronic component such as a semiconductor element 90 (see FIG. 4J) is mounted on the third conductor layer 41 of the first build-up layer 40, more wiring patterns (21a) can be formed in the first conductor layer 21 near the third conductor layer 41 in which wiring patterns to be connected to the electronic component tend to concentrate. Therefore, the number of layers of the wiring board 10 can be more efficiently reduced than in a case where a wiring density is increased by reducing widths of wiring patterns in other conductor layers. As a result, it is possible that the manufacturing cost of the wiring board 10 is reduced. Further, electronic components and the like are less likely to be connected via a conductor layer that is distanced from the third conductor layer 41, and a wiring length of a wiring pattern connecting between the electronic components and the like becomes shorter. As a result, it is possible that electrical characteristics of an electrical circuit or the like that is formed in the wiring board 10 are improved.

Further, as described above, the first conductor layer 21 is embedded in the insulating layer (30a) while one surface of the first conductor layer 21 on the first build-up layer 40 side is exposed from the insulating layer (30a) on the first surface (F1) of the core laminate body 20. Therefore, as illustrated in FIG. 1, the first surface (F1) of the core laminate body 20 is a substantially flat surface. An interlayer resin insulating layer that is laminated on a build-up layer of a build-up wiring board may be formed to have a thickness of about 20-100 µm so that a suitable rigidity can be maintained while satisfying demand for thinning of the wiring board. On the other hand, a conductor layer such as the first conductor layer 21 is formed to have a thickness of at least about 5-30 µm in order to have a predetermined conductivity. Therefore, when a conductor layer, such as the first conductor layer 21, of a surface layer part of a core laminate body (core substrate) is formed on an insulating layer of the surface layer part, it is possible that a level difference due to a thickness of the conductor layer is not absorbed in an interlayer resin insulating layer and appears on a surface of a build-up layer (for example, in FIG. 6, a level difference between a surface of a conductor layer 911 and a surface of an insulating layer 915 appears on a surface of an insulating layer 925). As a result, unevenness may occur in a surface of a printed wiring board. The tendency for such unevenness to occur may be further enhanced when an interlayer resin insulating layer that is laminated on a build-up layer is thinned in accordance with the rising demand for the thinning of a wiring board. When unevenness exists on a surface of a wiring board, it is possible that connection pads on the surface of the wiring board cannot be in contact with all electrodes of an electronic component or the like that is mounted on the wiring board. As a result, it is possible that a yield of mounting the electronic component to the wiring board is reduced. Such tendency may become significant along with an increase in size and a decrease in pitch of electrodes of a semiconductor element or the like as the semiconductor element or the like becomes more sophisticated.

In the wiring board 10 of the present embodiment, as illustrated in FIG. 2, the first conductor layer 21 that is formed in a surface layer part on the first surface (F1) side of the core laminate body 20 is embedded in the insulating layer (30a) by having only one surface thereof exposed. Therefore, the first surface (F1) of the core laminate body 20 is a substantially flat surface as illustrated in FIG. 1, and occurrence of unevenness of the surface of the wiring board 10 on the first surface (F1) side can be suppressed. Therefore, a situation where not all electrodes 91 (see FIG. 4J) of an electronic component such as the semiconductor element 90 (see FIG. 4J) can be in contact with connection pads (41a) that are formed on the surface of the wiring board 10 on the first surface (F1) side of the core laminate body 20 is unlikely to occur. As a result, reduction in yield of mounting an electronic component to the wiring board 10 is prevented. Therefore, for example, when a large semiconductor element or the like having fine-pitched terminals (electrodes) is mounted on the wiring board 10, it is preferable that the semiconductor element or the like be mounted on the surface of the first build-up layer 40, that is, on the third conductor layer 41 in the present embodiment. By doing so, occurrence of contact failure can be suppressed and the semiconductor element 90 or the like can be mounted with a good yield. Further, in this case, the large number of the electrodes 91 of the semiconductor element 90, as described above, can be connected to another electronic component or the like with a short wiring length via the first conductor layer 21 in which the wiring pattern (21a) having the minimum wiring width in the wiring board 10 is formed.

As illustrated in FIG. 2A, in the present embodiment, the core laminate body 20 has a structured in which the first conductor layer 21, the insulating layer (30a), an inner-layer conductor layer (27a), the insulating layer (30b), an inner-layer conductor layer (27b), the insulating layer (30c) and the second conductor layer 25 are sequentially laminated, and is formed by alternately laminating the conductor layers that form wiring patterns or the like and the insulating layers that insulate between the conductor layers. However, the numbers of the conductor layers and the insulating layers that form core laminate body 20 are not limited to those in the example illustrated in FIG. 2A, but can be increased or decreased depending on a scale, a wiring density and the like of circuit wiring that is formed in the wiring board 10. That is, it is also possible that the core laminate body 20 is formed by four or more insulating layers and five or more conductor layers, or by two or less insulating layers and three or less conductor layers.

As illustrated in FIG. 2A, in the present embodiment, the insulating layers (30a, 30b, 30c) (hereinafter, the insulating layers (30a, 30b, 30c) may be collectively referred as the insulating layers 30 when individual specification is not required) each include a core material 32 and a resin material 34 made of a resin composition. As will be described later, the insulating layers 30 may each be formed from a prepreg material in a semi-cured state obtained by impregnating the core material 32 with the resin material 32. The core material 32 is not particularly limited. Preferably, inorganic fiber such as glass fiber with superior insulation performance and rigidity can be used as the core material 32. The resin material 34 is also not particularly limited as long as the resin material 34 has pressure resistance and insulation performance required for the wiring board 10. For example, as the resin material 34, epoxy resin or bismaleimide triazine resin (BT resin) can be used, and preferably epoxy resin can be used. Further, the resin material 34 may be filled with an inorganic filler made of silica, alumina or the like. However, the materials from which the insulating layers 30 are formed are arbitrary. Materials different from the above-described materials may also be used as the core material 32 and the resin material 34. Further, the insulating layers 30 may also be formed of only the resin material 34 without including the core material 32. For example, an interlayer insulating material: ABF film ABF-GX13, ABF-GX92, ABF-GX-T31, ABF-GZ41 or the like, manufactured by Ajinomoto Co. Inc., can be used.

As illustrated in FIG. 2A, the first conductor layer 21 is embedded in the insulating layer (30a) such that only one surface of the first conductor layer 21 on the first build-up layer 40 side is exposed from the insulating layer (30a). In this way, due to the structure in which the first conductor layer 21 is embedded in the insulating layer (30a), in addition to that the first surface (F1) of the core laminate body 20 is a substantially flat surface as described above, adhesion between the first conductor layer 21 and the insulating layer (30a) is enhanced. Therefore, even when a wiring pattern with a narrow width is formed in the first conductor layer 21, the wiring pattern is unlikely to be peeled off from the insulating layer (30a).

As described above, the wiring pattern (21a) formed in the first conductor layer 21 is formed so as to have the minimum wiring width among the wiring patterns of the conductor layers that respectively form the core laminate body 20 and the first and second build-up layers (40, 50). A minimum L/S of the wiring patterns that are formed in the conductor layers other than first conductor layer 21 in the wiring board 10 of the present embodiment is (20 μm)/(20 μm), for example. Here, the "L" in the "L/S" indicates a minimum width of the wiring patterns that are formed in the conductor layers, and the "S" indicates a minimum interval between the wiring patterns. In contrast, the wiring pattern (21a) that is formed in the first conductor layer 21 of the wiring board 10 of the present embodiment is formed at an "L/S" less than (20 μm)/(20 μm), and is preferably formed at an "L/S" in a range of (5 μm)/(5 μm)–(18 μm)/(18 μm). For example, as will be described later, the first conductor layer 21 is formed only by pattern plating using an electroplating method, without using etching. Thereby, the wiring pattern (21a) can be formed at a fine pitch. However, the method forming the first conductor layer 21 is not limited to such a method. Other methods such as a full additive method in which the wiring pattern (21a) can be formed at a fine pitch may also be used. A material of the first conductor layer 21 is not particularly limited. However, copper is used that has high conductivity, is inexpensive and also has good deposition properties in the above-described electroplating method.

As illustrated in FIG. 2A, the second conductor layer 25 is formed on the insulating layer (30c). Further, the inner-layer conductor layer (27a) and the inner-layer conductor layer (27b) are respectively formed on surfaces of the insulating layer (30a) and the insulating layer (30b) on the second surface (F2) side of the core laminate body 20. Methods for forming the second conductor layer 25 and the inner-layer conductor layers (27a, 27b) (hereinafter, the inner-layer conductor layers (27a, 27b) may also be collectively referred to as the inner-layer conductor layers 27 when individual specification is not required) are not particularly limited. For example, as will be described later, the inner-layer conductor layer (27a) may be formed by laminating a metal foil 271 (made of copper, for example) (see FIG. 4C) on a surface of the insulating layer (30a) and depositing a first metal film 272 (see FIG. 4D) by electroless plating and a second metal film 273 (see FIG. 4E) by electroplating on a surface of the metal foil 271. The second conductor layer 25 and the inner-layer conductor layer (27b) may also be similarly formed. In this case, the second conductor layer 25 and the inner-layer conductor layers 27 are each formed by three layers including a metal foil, an electroless plating film and an electroplating film. However, without being limited to such a three-layer structure, the second conductor layer 25 and the inner-layer conductor layers 27 may each also be formed by, for example, an electroplating film only. Materials of the second conductor layer 25 and the inner-layer conductor layers 27 are also not particularly limited, and any conductive material, preferably a metal material such as copper or nickel, can be used. However, for the same reason as for the above-described first conductor layer 21, copper is particularly preferably used for all of the metal foil, the electroless plating film and the electroplating film.

As illustrated in FIG. 2A, the first interlayer resin insulating layer 45 that forms the first build-up layer 40 is laminated on the first conductor layer 21 and on a portion of the insulating layer (30a) where the first conductor layer 21 is not embedded. Further, the second interlayer resin insulating layer 55 that forms the second build-up layer 50 is laminated on the second conductor layer 25 and on a portion of the insulating layer (30c) that is not covered by the second conductor layer 25.

Figure 2B:
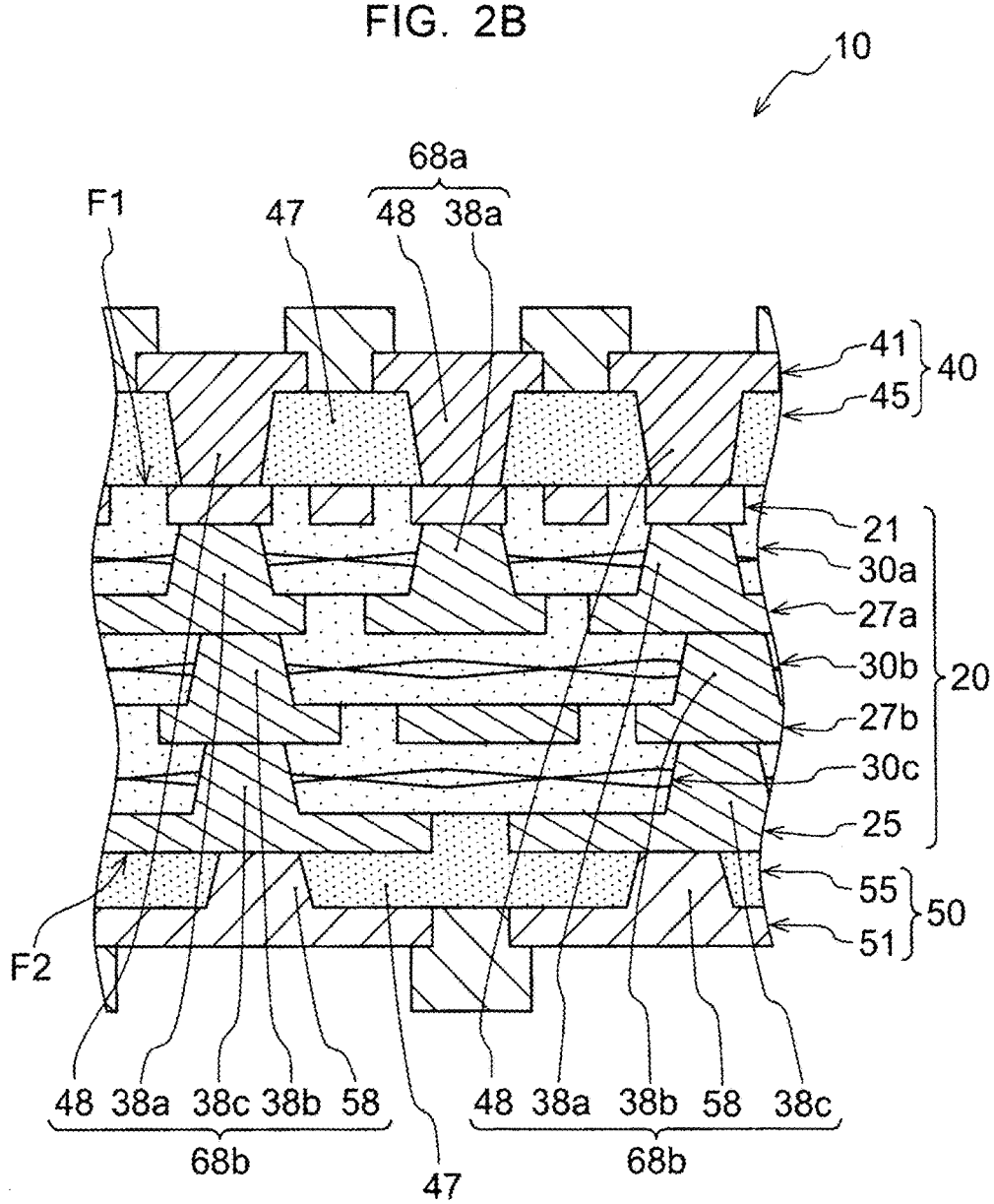
FIG. 2B is an enlarged view of a central portion of an example in which a core material is not included in an interlayer resin insulating layer of the wiring board illustrated in FIG. 1.

Similar to the above-described materials of the insulating layers 30, materials of the first and second interlayer resin insulating layers (45, 55) are not particularly limited. Therefore, as illustrated in FIG. 1, the first and second interlayer resin insulating layers (45, 55) may each include a core material 46 and a resin material 47 made of a resin composition. Further, the first and second interlayer resin insulating layers (45, 55) may also each be formed from a prepreg material in a semi-cured state obtained by impregnating the core material 46 with the resin material 47. Glass fiber or the like with superior insulation performance and rigidity is preferably used for the core material 46, and epoxy resin is preferably used for the resin material 47. Further, the first and second interlayer resin insulating layers (45, 55) may also each have a structure that does not contain the core material 46, and an example of such structures is illustrated in FIG. 2B. That is, the first interlayer resin insulating layer 45 of the first build-up layer 40 and the second interlayer resin insulating layer 55 of the second build-up layer 50 are each formed of only the resin material 47 that does not impregnate a core material. In this way, when a material that does not impregnate a core material is selected, for example, an interlayer insulating material: ABF film ABF-GX13, ABF-GX92, ABF-GX-T31, ABF-GZ41 or the like, manufactured by Ajinomoto Co. Inc., can be used. When the first and second interlayer resin insulating layers (45, 55) are each formed of only the resin material 47, it is possible that adhesion of an electroless plating film to a surface thereof is improved. Therefore, as will be described later in the method for manufacturing the wiring board 10, it is possible that the third and fourth conductor layers (41, 51) can be formed without requiring a metal foil (not illustrated in the drawings) laminated together with the first and second interlayer resin insulating layers (45, 55). Further, regardless of whether or not the core material 46 is impregnated with the resin material 47, the resin material 47 may be filled with an inorganic filler (not illustrated in the drawings) or the like made of silica or alumina. In this case, making the content of the inorganic filler 30-70 wt % with respect to the entire first interlayer resin insulating layer 45 or the entire second interlayer resin insulating layer 55 is preferable in that the adhesion to the third and fourth conductor layers (41, 51) is maintained while the thermal expansion coefficient of the first and second interlayer resin insulating layers (45, 55) and the thermal expansion coefficient of an electronic component (not illustrated in the drawings) that is mounted to the wiring board 10 are close to each other. However, the material for forming the first and second interlayer resin insulating layers (45, 55) is arbitrary. A material different from the above-described material may also be used.

As illustrated in FIG. 1, in the present embodiment, the third conductor layer 41 is formed on the surface of the wiring board 10 on the first surface (F1) side of the core laminate body 20; and the fourth conductor layer 51 is formed on the surface of the wiring board 10 on the second surface (F2) side. In the third conductor layer 41, the connection pads (41*a*) that connect to, for example, the electrodes 91 (see FIG. 4J) of the semiconductor element 90 (see FIG. 4J) may be formed, and further, connection pads that connect to another electronic component (not illustrated in the drawings) may also be formed. Further, also in the fourth conductor layer 51, an arbitrary conductor pattern including connection pads (51*a*) and the like may be formed for connecting to an electronic component (not illustrated in the drawings) or to an external wiring board on which the wiring board 10 is mounted. The first conductor layer 21 that is embedded in the insulating layers 30 is not directly used as a connection layer for connecting to the semiconductor element 90 or the like. As described above, the first build-up layer 40 is provided and the third conductor layer that is formed in the first build-up layer is used as the connection layer. Thereby, a gap (standoff) of a thickness of the third conductor layer 41 is ensured between the wiring board 10 and the semiconductor element 90 or the like. Therefore, stresses occurring in connecting portions between the wiring board 10 and the semiconductor element 90 or the like due to ambient temperature variation and the like are reduced, and the connection reliability of the semiconductor element 90 or the like is improved.

A method for forming the third and fourth conductor layers (41, 51) is not particularly limited. However, for example, the third and fourth conductor layers (41, 51) are formed using the same method as that for the second conductor layer 25 and the inner-layer conductor layer 27 described above. That is, the third and fourth conductor layers (41, 51) may be formed by laminating, for example, a metal foil (not illustrated in the drawings) made of copper on the first and second interlayer resin insulating layers (45, 55) and depositing an electroless plating film (not illustrated in the drawings) and an electroplating film (not illustrated in the drawings) on the metal foil. However, without being limited to such a structure, the third and fourth conductor layers (41, 51) may each also be formed by, for example, an electroplating film only. Materials of the third and fourth conductor layers (41, 51) are not particularly limited. Similar to the second conductor layer 25 and the inner-layer conductor layers 27 described above, metal materials such as copper and nickel are preferably used, and copper is particularly preferably used for all of the metal foil, the electroless plating film and the electroplating film.

In the present embodiment, as illustrated in FIG. 2A, via conductors (38*a*), via conductors (38*b*) and via conductors (38*c*) that penetrate through the insulating layers 30 of the core laminate body 20 are formed in the wiring board 10. The via conductors (38*a*) that penetrate through the insulating layer (30*a*) connect the first conductor layer 21 and the inner-layer conductor layer (27*a*). The via conductors (38*b*) that penetrate through the insulating layer (30*b*) connect the inner-layer conductor layer (27*a*) and the inner-layer conductor layer (27*b*). The via conductors (38*c*) that penetrate through the insulating layer (30*c*) connect the inner-layer conductor layer (27*b*) and the second conductor layer 25. Further, in the wiring board 10, as illustrated in FIG. 1, the via conductors 48 that penetrate through the first interlayer resin insulating layer 45 and connect the third conductor layer 41 and the first conductor layer 21 are formed, and similarly, the via conductors 58 that penetrate through the second interlayer resin insulating layer 55 and connect the fourth conductor layer 51 and the second conductor layer 25 are formed.

Methods for forming the via conductors (38*a*, 38*b*, 38*c*) (hereinafter, the via conductors (38*a*, 38*b*, 38*c*) may be collectively referred to as the via conductors 38 when individual specification is not required) and the via conductors (48, 58) are not particularly limited. For example, as will be described later, the via conductors (38*a*) are formed by embedding the first metal film 272 (see FIG. 4D) formed by electroless plating and the second metal film 273 (see FIG. 4E) formed by electroplating in through holes 39 (see FIG. 4D) that are formed by penetrating the insulating layer (30*a*) by irradiating, for example, $CO_2$ laser. The via conductors (38*b*, 38*c*), the via conductors 48 and the via conductors 58 may also be respectively formed using the same method in the insulating layers (30*b*, 30*c*) and the first and second interlayer resin insulating layers (45, 55). In an example illustrated in FIG. 4E, the through holes 39 in which the via conductors (38*a*) are formed are completely filled with the second metal film 273. However, without being limited to this, it is also possible that the through holes 39 are not completely filled. The same applies also to the via conductors (38*b*, 38*c*) and the via conductors (48, 58). Materials of the via conductors (38, 48, 58) are not particularly limited. However, copper is preferably used that has high conductivity, is inexpensive and also has good deposition properties in plating.

Further, as illustrated in FIGS. 1, 2A and 2B, the via conductors 38, via conductors 48 and via conductors 58 may be formed such that they are at least partially stacked on each other. As a result, laminated bodies (stack vias) of via conductors may be formed that connect between conductor layers that are provided via two or more of the insulating layers 30, the first interlayer resin insulating layer 45 and the second interlayer resin insulating layer 55. Here, that via conductors are "stacked" means not only that the via conductors are aligned on a straight line and are stacked, but also that the via conductors are stacked such that opposing end surfaces of an upper-layer via conductor and a lower-layer via conductor at least partially overlap in a plan view. For example, in the example illustrated in FIG. 2B, a stack via (68a) is formed by stacking two via conductors including a via conductor (38a) and a via conductor 48, and the third conductor layer 41 and the conductor layer (27a) are connected by the stack via (68a). Further, two stack vias (68b) are each formed by stacking five via conductors including a via conductor 48, via conductors (38a-38c), and a via conductor 58, that is, by stacking via conductors that are each formed in one of all the insulating layers and the interlayer resin insulating layers in the wiring board 10. Due to the stack vias (68b), the third conductor layer 41 that is a surface-layer conductor on one side of the wiring board 10 and the fourth conductor layer 51 that is a surface-layer conductor layer on the other side are connected via the first conductor layer 21, the conductor layers (27a, 27b) and the second conductor layer 25. FIG. 2B illustrates an example in which, as described above, the stack via (68a) in which two via conductors are stacked and the stack vias (68b) in each of which five via conductors are stacked are formed. However, a stack via can be formed at any position in the wiring board 10 by laminating any number of via conductors. In this way, when stack vias can be provided, design flexibility of wiring patterns that are formed in the wiring board 10 is improved. As a result, it is possible that the number of layers in the wiring board 10 is reduced, and the manufacturing cost of the wiring board 10 is reduced.

In the present embodiment, as illustrated in FIG. 1, the via conductors 48 are each formed in a shape of which an end surface on the first conductor layer 21 side is smaller than an end surface on the third conductor layer 41 side. On the other hand, the via conductors 58 are each formed in a shape of which an end surface on the second conductor layer 25 side, that is, on the first conductor layer 21 side, is smaller than an end surface on the fourth conductor layer 51 side; and the via conductors 38 are each formed in a shape of which an end surface on the first surface (F1) side, that is, on the first conductor layer 21 side, is smaller than an end surface on the second surface (F2) side of the core laminate body 20. In particular, in the example illustrated in FIG. 1, the via conductors 48, 58 and the via conductors 38 are each formed in a shape of which a cross section in a plane perpendicular to a thickness direction of the wiring board 10 (hereinafter, a cross section in such a plane is simply referred to as a horizontal cross section) is gradually reduced from an end surface on one side toward an end surface on the other side. That is, the via conductors 48, the via conductors 58 and the via conductors 38 are formed in such a manner that the horizontal cross sections of the via conductors 48 expand or shrink in a direction opposite to a direction in which the horizontal cross sections of the via conductors 58 and the via conductors 38 expand or shrink. In the example illustrated in FIG. 1, with the first conductor layer 21 as a dividing layer, the via conductors 48 that are formed on the first build-up layer 40 side and all the via conductors (38, 58) that are formed on the second build-up layer 50 side are each formed in a shape of which a horizontal cross section shrinks toward the first conductor layer 21 side. As will be described later, in a case where the through holes 39 (see FIG. 4D) and the like are formed by irradiating, for example, $CO_2$ laser or the like to the insulating layer 30 from the second surface (F2) side of the core laminate body 20 and through holes (not illustrated in the drawings) of the via conductors (48, 58) are respectively formed by respectively irradiating $CO_2$ laser or the like to the first and second interlayer resin insulating layers (45, 55) from the sides of the third and fourth conductor layers (41, 51), the via conductors (38, 48, 58) are likely to be each formed in a shape of which an end surface on the first conductor layer 21 side is smaller than an end surface on the opposite side as illustrated in FIG. 1. Further, as described above, in the case where a material that does not contain the core material (46, 32) is used for the insulating layer 30 or the first and second interlayer resin insulating layers (45, 55), the via conductors are likely to be each formed in a shape, that is, a tapered shape, of which a horizontal cross section gradually shrinks (expands) from an end surface on one side toward an end surface on the other side. However, as illustrated in FIG. 1 and the like, even when a material that does not contain the core material 46 is used for the insulating layer 30 or the first and second interlayer resin insulating layers (45, 55), it is also possible that the via conductors are formed that are each tapered from an end surface on one side toward the other side.

In the present embodiment, as illustrated in FIG. 1, a solder resist layer 60 is formed on the first interlayer resin insulating layer 45 and on a portion of the third conductor layer 41 excluding the connection pads (41a) to which the semiconductor element 90 (see FIG. 4J) is connected. Further, a solder resist layer 61 is formed on the second interlayer resin insulating layer 55 and on a portion of the fourth conductor layer 51 excluding the connection pads (51a). The portions where the solder resist layers (60, 61) are formed are not limited to these. Depending on the type and number of electronic components (not illustrated in the drawings) mounted on the wiring board 10, the solder resist layers (60, 61) may be provided on any portions of the third and fourth conductor layers (41, 51). Further, any portions of the conductor layers (41, 51) may be exposed without being covered by the solder resist layers (60, 61).

A material of the solder resist layers (60, 61) is not particularly limited as long as the material has good solder dip resistance and insulation performance. However, for example, the solder resist layers (60, 61) are formed using epoxy resin, acrylic resin or the like, and preferably, are formed using a material made of epoxy resin containing 40-70 wt % of an inorganic filler such as SiO2.

Further, a corrosion-resistant layer or solder coating layer (not illustrated in the drawings), made of, for example, Ni/Au, Ni/Pd/Au, Sn or an organic protective film (OSP), may be formed on exposed surfaces of the third and fourth conductor layers (41, 51) where the solder resist layers (60, 61) are not formed, such as the surfaces of the connection pads (41a, 51a).

Figure 3:
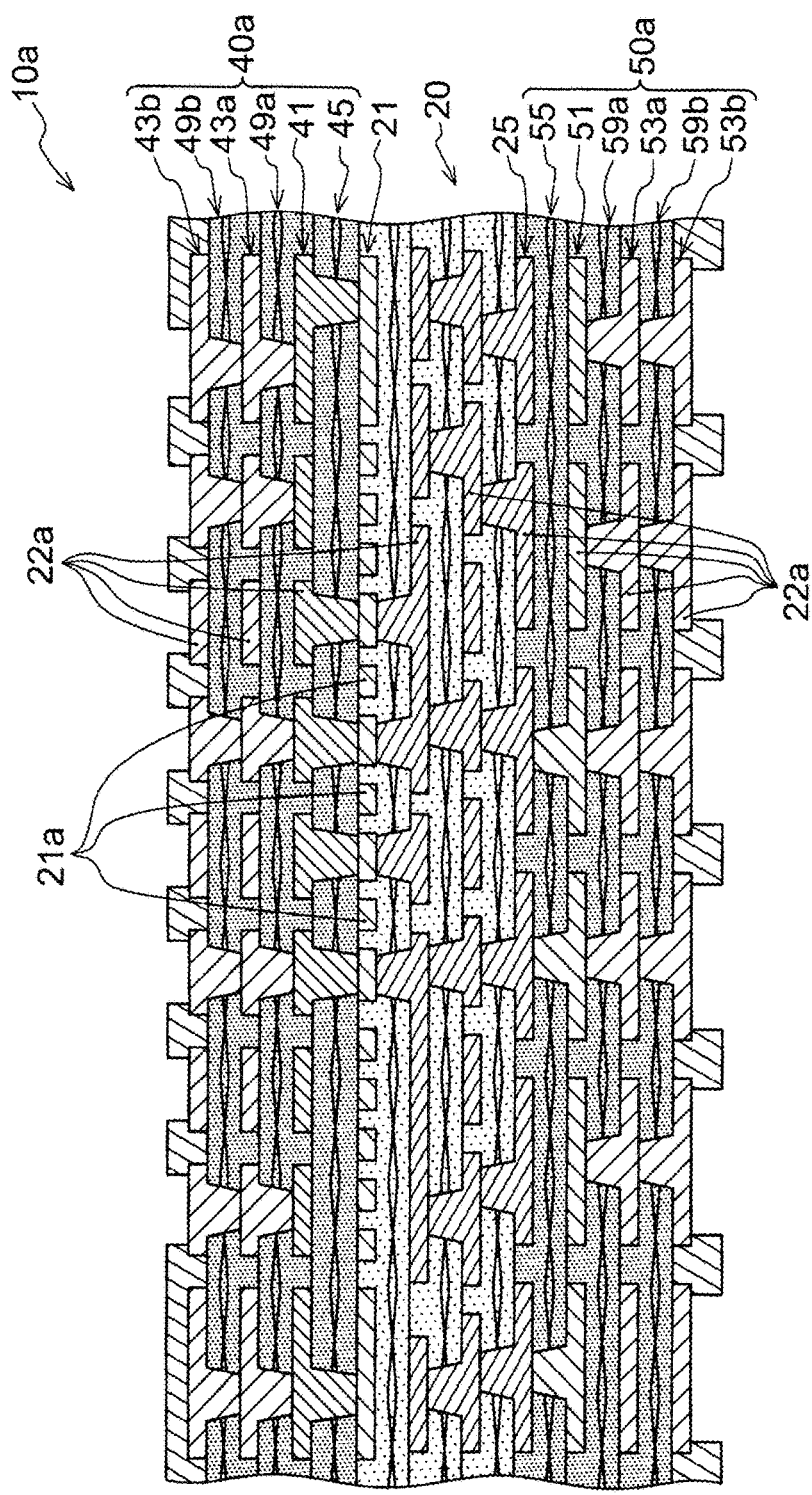
FIG. 3 is a cross-sectional view of a printed wiring board according to another embodiment of the present invention.

In the wiring board 10 of the embodiment illustrated in FIGS. 1 and 2A, the first build-up layer 40 is formed by the third conductor layer 41 and the first interlayer resin insulating layer 45, and similarly, the second build-up layer 50 is formed by the fourth conductor layer 51 and the second interlayer resin insulating layer 55. The first and second build-up layers (40, 50) are each formed by laminating one conductor layer and one interlayer resin insulating layer. However, it is also possible that the first and second build-up layers each include multiple conductor layers and multiple interlayer resin insulating layers and are each formed by alternately laminating the conductor layers and the interlayer resin insulating layers. FIG. 3 illustrates an example of a wiring board (10a) of another embodiment that has first and second build-up layers that each includes multiple conductor layers and multiple interlayer resin insulating layers.

The wiring board (10a) of another embodiment illustrated in FIG. 3 includes a first build-up layer (40a) that is formed on the first conductor layer 21 of the core laminate body 20 and a second build-up layer (50a) that is formed on the second conductor layer 25. The first build-up layer (40a) is formed by laminating, sequentially from the first conductor layer 21 side, the first interlayer resin insulating layer 45 and the third conductor layer 41, and further laminating, on the third conductor layer 41, an interlayer resin insulating layer (49a), a conductor layer (43a), an interlayer resin insulating layer (49b) and a conductor layer (43b) in this order. Similarly, the second build-up layer (50a) is formed by laminating, sequentially from the second conductor layer 25 side, the second interlayer resin insulating layer 55 and the fourth conductor layer 51, and further laminating, one the fourth conductor layer 51, an interlayer resin insulating layer (59a), a conductor layer (53a), an interlayer resin insulating layer (59b) and a conductor layer (53b) in this order. In this way, the first and second build-up layers may each be formed from multiple conductor layers and multiple interlayer resin insulating layers. The numbers of the conductor layers and the interlayer resin insulating layers that form each of the build-up layers can be suitably selected according a scale and the like of an electrical circuit that is formed in the wiring board (10a). The wiring board (10a) of another embodiment illustrated in FIG. 3 has the same structure as the wiring board 10 of the embodiment illustrated in FIG. 1 except the first and second build-up layers (40a, 50a). Therefore, description about elements other than the first and second build-up layers (40a, 50a) is omitted.

As illustrated in FIG. 3, also in the wiring board (10a) of another embodiment, the wiring pattern (21a) that is formed in the first conductor layer 21 is formed such that the minimum width of the wiring pattern (21a) is smaller than minimum widths of all wiring patterns (22a) that are respectively formed in other conductor layers in the wiring board (10a). In the example illustrated in FIG. 3, the first build-up layer (40a) includes conductor layers. Therefore, as compared to the wiring board 10 of the embodiment illustrated in FIG. 1, the first conductor layer 21 is distanced from the surface-layer conductor layer (43b) on which an electronic component (not illustrated in the drawings) or the like is mounted. However, in the entire wiring board (10a), the first conductor layer 21 is positioned relatively close to the conductor layer (43b). Therefore, the wiring pattern (21a) of the first conductor layer 21 is formed with the minimum wiring width and more wiring patterns are formed in the first conductor layer 21. Thereby, it is possible that wiring patterns that are connected to an electronic component can be formed with a relatively short wiring length.

Next, a method for manufacturing the wiring board 10 of the embodiment illustrated in FIGS. 1 and 2A is described with reference to FIG. 4A-4J.

Figure 4A:
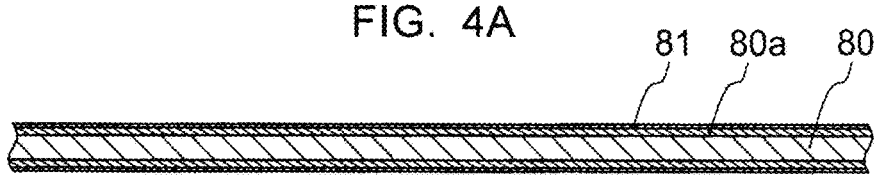
FIG. 4A is an explanatory diagram of a process of a method for manufacturing the printed wiring board illustrated in FIG. 1.

In the method for manufacturing the wiring board 10 of the present embodiment, first, the core laminate body 20 (see FIG. 1) is manufactured. First, as illustrated in FIG. 4A, as starting materials, a support plate 80, a support copper foil (80a) and a base metal foil 81 are prepared. The carrier copper foil (80a) is laminated on both sides of the support plate 80 and is bonded to both sides of the support plate 80 by applying heat and pressure. A prepreg material or the like in a semi-cured state made of a material obtained by impregnating a core material such as a glass cloth with an insulating resin such as epoxy is preferably used for the support plate 80. However, without being limited to this, other materials may also be used. A material of the base metal foil 81 is not particularly limited as long as the first conductor layer 21 (see FIG. 4B) (to be described later) can be formed on a surface of the material. However, a copper foil or a nickel foil having a thickness of 2-6 μm is preferably used, and a copper foil having a thickness of 5 μm is more preferably used. Further, for example, a copper foil having a thickness of 15-30 μm, preferably 18 μm, is used for the carrier copper foil (80a). However, the base metal foil 81 and the carrier copper foil (80a) are not limited to have these thicknesses, but may also have other thicknesses.

A method for bonding the carrier copper foil (80a) and the base metal foil 81 is not particularly limited. However, for example, substantially entire sticking surfaces of the two may be boned by a thermoplastic adhesive (not illustrated in the drawings), or, the two may be bonded by an adhesive, or by ultrasonic connection, in a margin portion in a vicinity of an outer periphery where a conductor pattern of the first conductor layer 21 (see FIG. 4B) (to be described later) is not provided. Further, the carrier copper foil (80a) and the base metal foil 81 may be bonded to each other before the carrier copper foil (80a) is bonded to the support plate 80. However, without being limited to this, for example, it is also possible that a double-sided copper-clad laminated plate is used for the support plate 80; a copper foil that is already bonded to both sides of the double-sided copper-clad laminated plate is used as the carrier copper foil (80a); and the single base metal foil 81 is bonded to the copper foil using the above-described method or the like.

In FIG. 4A-4F, an example of an manufacturing method is illustrated in which the base metal foil 81 is bonded to surfaces on both sides of the support plate 80, and the core laminate body 20 is formed on each of the surfaces. This is preferable in that, when the wiring board 10 is formed on each of both sides of the support plate 80, two core laminate bodies 20 are manufactured at once. However, it is also possible that the core laminate body 20 is formed on only one side of the support plate 80. Further, it is also possible that core laminate bodies having mutually different circuit patterns are formed on both sides of the support plate 80. The following description is given with reference to FIG. 4A-4F that illustrate an example in which the same circuit patterns are formed on both sides of the support plate 80. Therefore, the description is given regarding only one side, and the description regarding the other side and reference numeral symbols for the other side in the drawings are omitted.

Figure 4B:
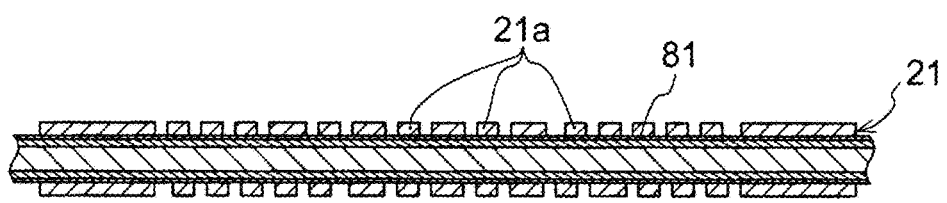
FIG. 4B is an explanatory diagram of a process of the method for manufacturing the printed wiring board illustrated in FIG. 1.

As illustrated in FIG. 4B, the first conductor layer 21 is formed on the base metal foil 81. In the wiring board 10 of the embodiment illustrated in FIG. 1, the wiring pattern (21a) that is formed in the first conductor layer 21 is formed to have a wiring width smaller than those of wiring patterns formed in all other conductor layers in the wiring board 10. For the formation of the first conductor layer 21, a method that allows the wiring pattern (21a) to be formed at a fine pitch is used, and preferably a method that allows the wiring pattern (21a) to be formed at an L/S of (5 μm)/(5 μm)-(18 μm)/(18 μm) is used. For example, the first conductor layer 21 is formed only by pattern plating using an electroplating method, without using any etching. Specifically, first, a plating resist film (not illustrated in the drawings) is formed in a predetermined region other than a portion where the first conductor layer 21 is formed on the base metal foil 81. That is, the plating resist film is formed with a pattern corresponding to the wiring pattern (21a) of a desired fine L/S. Next, a plating film is formed by, for example, electroplating using the base metal foil 81 as a seed layer on a portion of the base metal foil 81 where the plating resist film is not formed. Thereafter, the plating resist film is removed. As a result, as illustrated in FIG. 4B, the first conductor layer 21 including the wiring pattern (21a) that is formed at the desired fine L/S is formed on the base metal foil 81. The first conductor layer 21 is preferable an electroplating film made of copper.

Figure 4C:
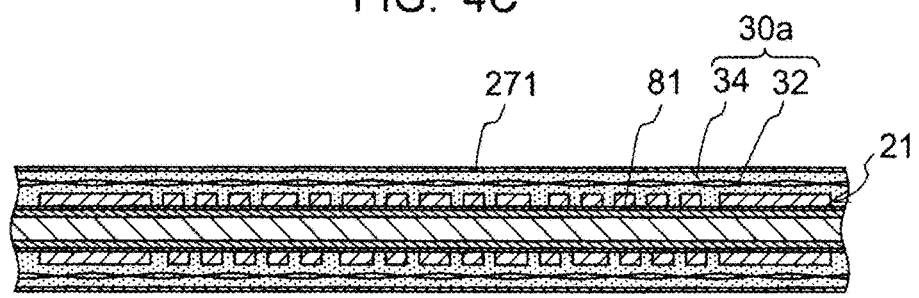
FIG. 4C is an explanatory diagram of a process of the method for manufacturing the printed wiring board illustrated in FIG. 1.

As illustrated in FIG. 4C, the insulating layer (prepreg) (30a) in a semi-cured state is laminated on the base metal foil 81 and on the first conductor layer 21. Further, the metal foil 271 is laminated on the insulating layer (30a). Thereafter, the metal foil 271 and the insulating layer (30a) are pressed toward the support plate 80 side are further heated. As a result, the insulating layer (30a) is completely cured and is bonded to the base metal foil 81 and the first conductor layer 21 and to the metal foil 271. In FIG. 4C, the insulating layer (30a) is illustrated as being formed by the core material 32 and the resin material 34 made of a resin composition. However, it is also possible that the insulating layer (30a) is formed of only the resin material 34 without including the core material 32. Further, the core material 32 may be inorganic fiber such as a glass cloth.

Figure 4D:
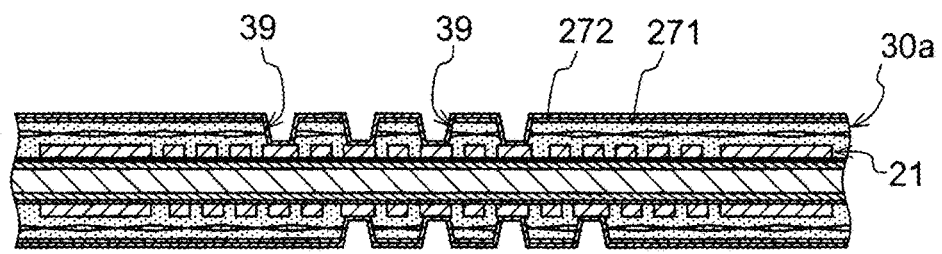
FIG. 4D is an explanatory diagram of a process of the method for manufacturing the printed wiring board illustrated in FIG. 1.

As illustrated in FIG. 4D, the through holes 39 that penetrate through the metal foil 271 and the insulating layer (30a) and expose the first conductor layer 21 are formed. Specifically, laser light is irradiated using, for example, $CO_2$ laser from a surface side of the metal foil 271 to predetermined positions on the metal foil 271. As a result, as illustrated in FIG. 4D, the through holes 39 are formed. After the formation of the through holes 39, preferably, desmear is performed with respect to the through holes 39. Further, in order to improve absorption efficiency of laser light, the surface of the metal foil 271 may be subjected to a blackening treatment before laser light irradiation. As illustrated in FIG. 4D, the through holes 39 may be formed to have a larger hole size on the side to which the $CO_2$ laser is irradiated, that is, on the metal foil 271 side, than on the first conductor layer 21 side. When the through holes 39 are each formed in such a shape, there is an advantage that, for example, when the first metal film 272 and the second metal film 273 are formed using a wet plating method in the next process, it is easy for a plating solution to enter deep into the through holes 39.

Next, the first metal film 272 is formed on the metal foil 271 and in the through holes 39. As will be described later, the first metal film 272 functions as a seed layer when the second metal film 273 is formed by electroplating. The first metal film 272 is preferably formed by electroless plating. When formed by electroless plating, the first metal film 272 preferably has a thickness of 0.3-1 μm. In other preferred examples, the first metal film 272 is formed using a sputtering method. When formed using a sputtering method, the first metal film 272 preferably has a thickness of 0.05-0.2 μm. A material of the first metal film 272 is not particularly limited. However, copper is preferably used. However, the method and the material for forming the first metal film 272 are not limited to these. Other methods and materials may also be used.

Figure 4E:
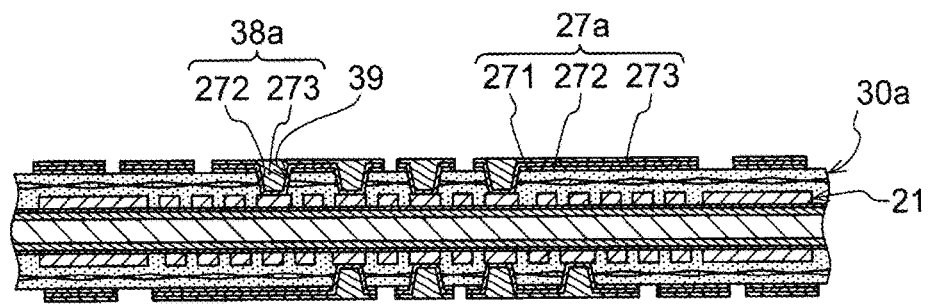
FIG. 4E is an explanatory diagram of a process of the method for manufacturing the printed wiring board illustrated in FIG. 1.

As illustrated in FIG. 4E, the second metal film 273 is formed on the first metal film 272. A method for forming the second metal film 273 is not particularly limited. However, forming the second metal film 273 using an electroplating method is preferable in that a thick film can be formed in a short time period. When the second metal film 273 is formed using an electroplating method, first, a plating resist film (not illustrated in the drawings) is formed on the first metal film 272. The plating resist film is formed outside areas above the through holes 39 and on portions of the first metal film 272 where the inner-layer conductor layer (27a) is not formed. Next, the second metal film 273 is formed using an electroplating method inside the through holes 39 and on portions of the first metal film 272 where the plating resist film is not formed. As a result, the through holes 39 are filled with the second metal film 273 and, as illustrated in FIG. 4E, the via conductors (38a) made of the first and second metal films 272, 273 are formed.

Next, the plating resist film is peeled off. The first metal film 272 that is exposed by peeling off the plating resist film and the metal foil 271 below the first metal film 272 are removed, for example, by etching. As a result, as illustrated in FIG. 4E, the inner-layer conductor layer (27a) including the metal foil 271, the first metal film 272 and the second metal film 273 is formed on a surface of the insulating layer (30a) on a side where the first conductor layer 21 is not embedded.

Figure 4F:
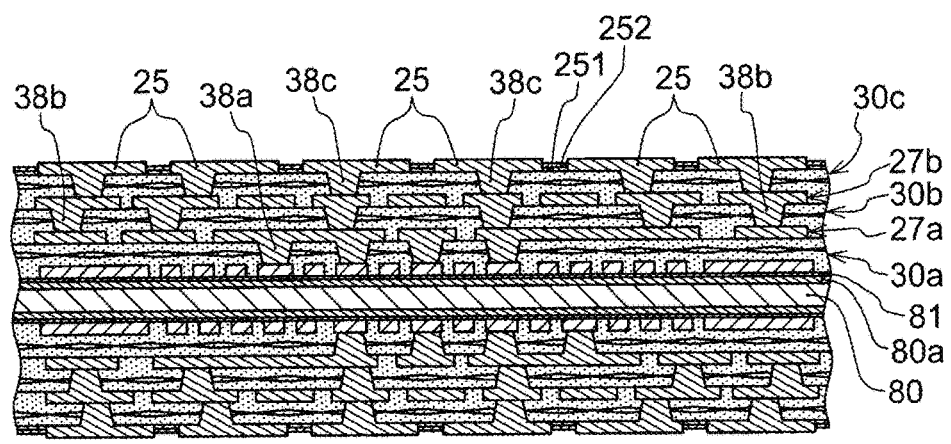
FIG. 4F is an explanatory diagram of a process of the method for manufacturing the printed wiring board illustrated in FIG. 1.

As illustrated in FIG. 4F, the insulating layer (30b), the inner-layer conductor layer (27b), the insulating layer (30c) and the second conductor layer 25 are sequentially laminated and formed on the inner-layer conductor layer (27a) and on the portion of the insulating layer (30a) where the inner-layer conductor layer (27a) is not formed. Further, along with the formation of the inner-layer conductor layer (27b), the via conductors (38b) that connect the inner-layer conductor layer (27b) and the inner-layer conductor layer (27a) are formed, and long with the formation of the second conductor layer 25, the via conductors (38c) that connect the second conductor layer 25 and the inner-layer conductor layer (27b) are formed. The insulating layer (30b), the inner-layer conductor layer (27b) and the via conductors (38b), and the insulating layer (30c), the second conductor layer 25 and the via conductors (38c) can be respectively formed in the same way as the insulating layer (30a), the inner-layer conductor layer (27a) and the via conductors (38a) by repeating the same processes as the processes illustrated in FIG. 4C-4E. By repeating a large (small) number of times the processes illustrated in FIG. 4C-4E, a large (small) number of insulating layers 30 (see FIG. 1), inner-layer conductor layers 27 (see FIG. 1) and via conductors 38 (see FIG. 1) can be respectively formed. Here, in the process in which the second conductor layer 25 is formed, portions of the metal foil 251 and the first metal film 252 where the plating resist film (not illustrated in the drawings) is formed may remain as illustrated in FIG. 4F, without being immediately removed following the peeling of the plating resist film. This is because the remaining portions of the metal foil 251 and the first metal film 252 can be removed together with the base metal foil 81 as will be described later. In the example illustrated in FIG. 4F, the via conductors (38b, 38c) are formed such that the horizontal cross sections of the via conductors (38b, 38c) expand (shrink) in the same direction as the direction in which the horizontal cross sections of the via conductors (38a) expand (shrink).

Figure 4G:
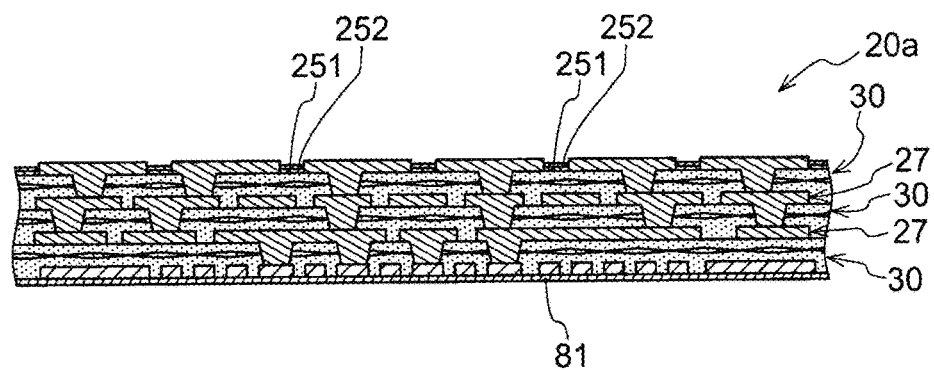
FIG. 4G is an explanatory diagram of a process of the method for manufacturing the printed wiring board illustrated in FIG. 1.

Next, the support plate 80 and the carrier copper foil (80a) are separated from the base metal foil 81. Specifically, first, for example, in a state in which the core laminate body in a halfway process illustrated in FIG. 4F is heated and the thermoplastic adhesive (not illustrated in the drawings) that bonds the carrier copper foil (80a) and the base metal foil 81 is softened, a force is applied to the support plate 80 and the carrier copper foil (80a) in a direction along an interface with the base metal foil, and the two are separated. Or, as described above, when the carrier copper foil (80a) and the base metal foil 81 are bonded by an adhesive or by ultrasound connection in the margin portion of the vicinity of the outer periphery, it is also possible that the carrier copper foil (80a), the base metal foil 81 and the support plate 80 together with the insulating layer (30a) and the like are cut on an inner peripheral side than the bonding area and the bonding area due to the adhesive or the like is removed, and thereby, the carrier copper foil (80a) and the base metal foil 81 are separated. As a result, laminates that are formed on the surfaces on both sides of the support plate 80 and each include the insulating layers 30, the inner-layer conductor layers 27 and the like are each a halfway-processed product (20a) of an individual core laminate body. The halfway-processed product (20a) of the core laminate body in this state is illustrated in FIG. 4G. FIG. 4G illustrates only the halfway-processed product (20a) of the core laminate body that includes the insulating layer (30a), the inner-layer conductor layer (27a) that is illustrated on the upper side of the support plate 80 in FIG. 4F.

Figure 4H:
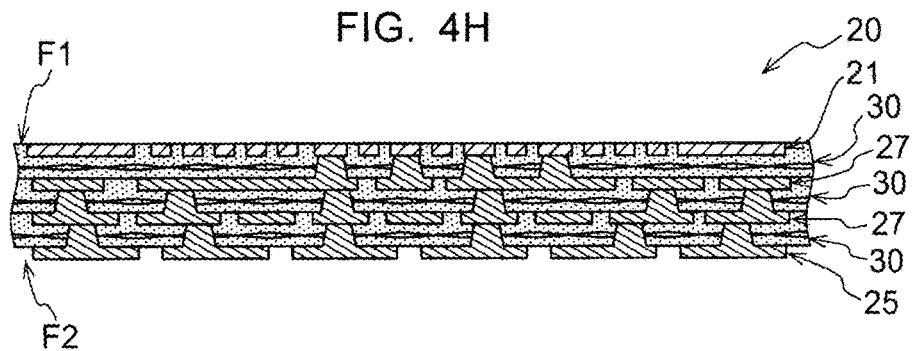
FIG. 4H is an explanatory diagram of a process of the method for manufacturing the printed wiring board illustrated in FIG. 1.
Figure 4I:
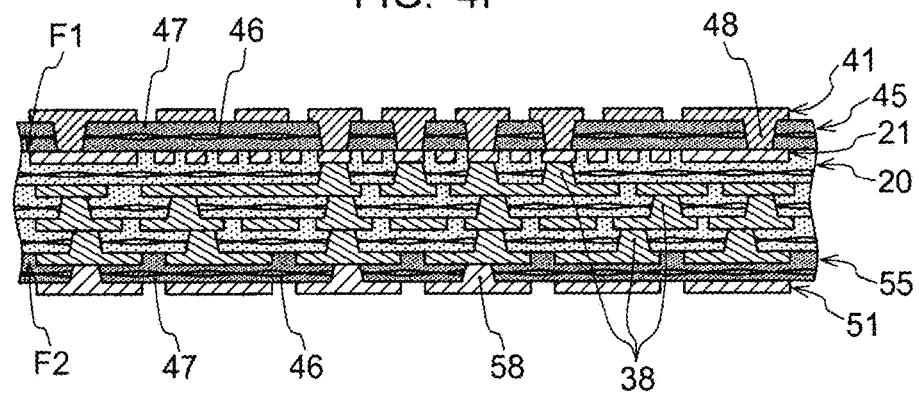
FIG. 4I is an explanatory diagram of a process of the method for manufacturing the printed wiring board illustrated in FIG. 1.
Figure 4J:
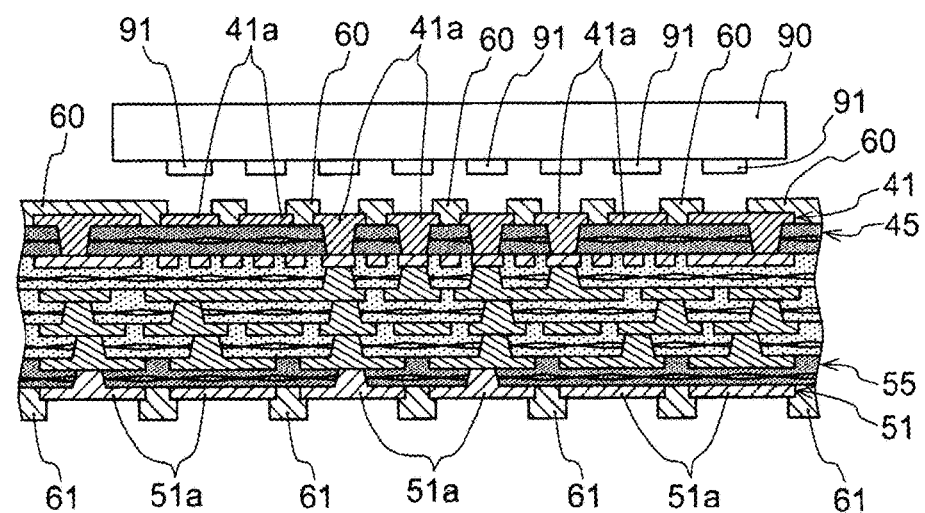
FIG. 4J is an explanatory diagram of a process of the method for manufacturing the printed wiring board illustrated in FIG. 1.

Next, the base metal foil 81 is removed, for example, by etching or the like. As described above, even when the portions of the metal foil 251 and the first metal film 252 where the plating resist film (not illustrated in the drawings) is formed remain without being removed, the portions of the metal foil 251 and the first metal film 252 can be removed together with the base metal foil 81 is the process in which the base metal foil 81 is removed. In this way, when the metal foil 251 and the first metal film 252 are removed in the same process as the base metal foil 81, at least one etching process or the like can be omitted. Therefore, the manufacturing process of the wiring board is shortened and the manufacturing cost is reduced. By removing the base metal foil 81, one surface of the first conductor layer is exposed. As a result, as illustrated in FIG. 4H, the core laminate body 20 is complete, having the first surface (F1) and the second surface (F2) that is on the opposite side of the first surface (F1), being formed by alternately laminating the inner-layer conductor layers 27 and the insulating layers 30, and having the first conductor layer 21 that has one surface exposed and is embedded in the insulating layer 30 on the first surface (F1) side and the second conductor layer 25 that is formed on the second surface (F2) side. The first conductor layer 21 is an embedded wiring that is embedded in the insulating layer 30 and thus can be in a fine pattern. Further, the exposed surface of the first conductor layer 21 and the surface of the insulating layer 30 are substantially flush with each other. Thereby, a flat first surface (F1) of the core laminate body 30 can be formed. Therefore, by etching the base metal foil 81, the first surface (F1) of the core laminate body 20, including the exposed surface of the first conductor layer 21 that is embedded in the insulating layer 30, is exposed. By using this first surface as an F surface, that is, a surface on the mounting side of the semiconductor element 90 (see FIG. 4J) such as an IC chip, mountability of an electronic component such as the semiconductor element 90 can be improved, and that good electrical characteristics cannot be obtained due to that a wiring length of a wiring connecting between electronic components becomes long can be prevented. FIG. 4H illustrates the core laminate body 20 in an orientation in which the halfway-processed product (20a) of the core laminate body illustrated in FIG. 4G is rotated for 180 degrees about an axis perpendicular to the drawing so as to match the wiring board 10 illustrated in FIG. 1. In FIGS. 4I and 4J that are referenced in the following description, the core laminate body 20 is illustrated in the same orientation as in FIG. 4H.

As illustrated in FIG. 4I, on the first surface (F1) of the core laminate body 20, the first interlayer resin insulating layer 45 is laminated. Further, the via conductors 48 that penetrate through the first interlayer resin insulating layer 45 are formed and the third conductor layer 41 is formed on the first interlayer resin insulating layer 45. Further, on the second surface (F2) of the core laminate body 20, the second interlayer resin insulating layer 55 is laminated. Further, the via conductors 58 that penetrate through the second interlayer resin insulating layer 55 are formed and the fourth conductor layer 51 is formed on the second interlayer resin insulating layer 55. The first interlayer resin insulating layer 45, the third conductor layer 41 and the via conductors 48, and the second interlayer resin insulating layer 55, the fourth conductor layer 51 and the via conductors 58 can be respectively formed in the same way as the insulating layer (30a), the inner-layer conductor layer (27a) and the via conductors (38a) of the core laminate body 20 by repeating the same processes as the processes illustrated in FIG. 4C-4E. Therefore, regarding these processes, a detailed description with reference to the drawings is omitted, and a schematic description is given below.

First, an insulating layer (prepreg) in a semi-cured state and a metal foil are laminated on each the first surface (F1) and the second surface (F2) of the core laminate body 20 and are bonded thereto by pressing and heating. As a result, the first interlayer resin insulating layer 45 is formed on the first surface (F1) and the second interlayer resin insulating layer 55 is formed on the second surface (F2). Next, through holes that penetrate through the metal foil on the first surface (F1) side and the first interlayer resin insulating layer 45 and expose the first conductor layer 21 are formed, and through holes that penetrate through the metal foil on the second surface (F2) side and the second interlayer resin insulating layer 55 and expose the second conductor layer 25 are formed The through holes are formed, for example, by irradiating laser light from a surface side of each of the metal foils. Next, a first metal film is formed on each of the metal foils and in each of the through holes preferably using an electroless plating method or a sputtering method. Next, a second metal film is formed on the first metal film preferably using an electroplating method. In this case, first, a plating resist film is formed outside areas above the through holes and on portions of the first metal film where the third conductor layer and the fourth conductor layer are not formed. Next, a second metal film is formed by electroplating in the through holes and on portions of the first metal film where the plating resist film is not formed. As a result, the through holes are filled with the second metal film and, as illustrated in FIG. 4I, the via conductors 48 are formed in the first interlayer resin insulating layer 45 and the via conductors 58 are formed in the second interlayer resin insulating layer 55. Next, the plating resist film is peeled off. The first metal film that is exposed by peeling off the plating resist film and the metal foil below the first metal film are removed by etching or the like. As a result, as illustrated in FIG. 4I, the third conductor layer 41 is formed on the first interlayer resin insulating layer 45, and the fourth conductor layer 51 is formed on the second interlayer resin insulating layer 55. The third conductor layer 41 is formed, for example, by being patterned in a predetermined conductor pattern including the connection pads (41a) (see FIG. 4J) and the like by providing the above-described plating resist film in a suitable pattern on the first metal film. Similarly, the fourth conductor layer 51 is formed, for example, by being patterned in a predetermined conductor pattern including the connection pads (51a) (see FIG. 4J). As described above, for the first and second interlayer resin insulating layers (45, 55), a material that does not include the core material 46 (see FIG. 1), for example, an interlayer insulating material: ABF film from Ajinomoto Co. Inc., may be used. In this case, the third conductor layer 41 and the fourth conductor layer 51 can be formed using an SAP (Semi Additive Process) method.

In the method for manufacturing the wiring board 10 of the present embodiment, as described above, the processes in which the first interlayer resin insulating layer 45, the via conductors 48 and the third conductor layer 41 are formed and the processes in which the second interlayer resin insulating layer 55, the via conductors 58 and the fourth conductor layer 51 are formed can be simultaneously performed on the first surface (F1) side and on the second surface (F2) side of the core laminate body 20. Therefore, in the processes in which the core laminate body 20 is formed (see FIG. 4B-4F), manufacturing lead time from input to completion of the wiring board 10 can be shortened, for example, as compared to forming the core laminate body by further laminating two sets of insulating layers and conductor layers on only one side of the second conductor layer 25 and the like.

When the wiring board (10a) of another embodiment that is described with reference to FIG. 3 is manufactured, by repeating twice the same process as the above-described process in which the first interlayer resin insulating layer 45, the third conductor layer 41, the second interlayer resin insulating layer 55 and the fourth conductor layer 51 are formed, as illustrated in FIG. 3, the interlayer resin insulating layers (49a, 49b) and the conductor layers (43a, 43b) can be formed on the third conductor layer 41, and the interlayer resin insulating layers (59a, 59b) and the conductor layers (53a, 53b) can be formed on the fourth conductor layer 51. Further, by increasing (reducing) the number of times of repeating the process in which the conductor layers and the interlayer resin insulating layers are formed, a first build-up layer and a second build-up layer that have the number of laminated layers larger (smaller) than that of the example illustrated in FIG. 3 can be formed.

Further, in the method for manufacturing the wiring board 10 of the present embodiment, the first conductor layer 21 is embedded in the first surface (F1). Therefore, the first surface (F1) of the core laminate body 20 is a substantially flat surface, and occurrence of unevenness on the surface of the wiring board 10 is suppressed and thus, as described above, reduction in the field of mounting the electronic component to the wiring board 10 can be prevented.

In the above-described formation of the via conductors 48 and the via conductors 58, the through holes, in which the via conductors 48 are formed, are formed by irradiating laser light to the first interlayer resin insulating layer 45 from the side on which the third conductor layer 41 is formed. The through holes, in which the via conductors 58 are formed, are formed by irradiating laser light to the second interlayer resin insulating layer 55 from the side on which the fourth conductor layer 51 is formed. Therefore, in the example illustrated in FIG. 4I, the via conductors 48, the via conductors 58 and the via conductors 38 are formed in shapes such that cross sections of the via conductors 48 expand (shrink) in a direction opposite to a direction in which cross sections of the via conductors 58 and the via conductors 38 expand (shrink).

In FIG. 4I, the first and second interlayer resin insulating layers (45, 55) are illustrated to each include the core material 46. However, as described above, the first and second interlayer resin insulating layers (45, 55) may also be formed of only the resin material 47 made of a resin composition without the core material 46. For example, an interlayer insulating material: ABF film ABF-GX13, ABF-GX92, ABF-GX-T31, ABF-GZ41 or the like, manufactured by Ajinomoto Co. Inc., can be used. Further, the core material 46 may be inorganic fiber such as a glass cloth. Further, in the resin material 47, for example, an inorganic filler (not illustrated in the drawings) such as silica may be included at a content rate of about 30-70 wt %.

As illustrated in FIG. 4J, the solder resist layer 60 is formed on a portion of the surface of the third conductor layer 41 excluding the connection pads (41a) and on the surface of the first interlayer resin insulating layer 45 where the third conductor layer 41 is not formed. Further, the solder resist layer 61 is formed on a portion of the surface of the fourth conductor layer 51 excluding the connection pads (51a) and on the surface of the second interlayer resin insulating layer 55 where the fourth conductor layer 51 is not formed.

The solder resist layers (60, 61) are formed, for example, as follows. A layer of a photosensitive epoxy material or the like is formed on entire surfaces of the first interlayer resin insulating layer 45 and the third conductor layer 41 and on entire surfaces of the second interlayer resin insulating layer 55 and the fourth conductor layer 51. Thereafter, predetermined portions of the epoxy material layer where the solder resist layers (60, 61) are formed are exposed, and unexposed portions of the epoxy material layer are removed by development. However, without being limited to this, the solder resist layers (60, 61) may also be provided using other methods such as screen printing in which a mask that opens to a predetermined pattern is used. Further, the solder resist layers (60, 61) may also be formed, for example, as follows. A layer made of a non-photosensitive epoxy material or the like is formed on the entire surfaces of the first interlayer resin insulating layer 45 and the third conductor layer 41 and on the entire surfaces of the second interlayer resin insulating layer 55 and the fourth conductor layer 51. Thereafter, portions of the epoxy material layer where the solder resist layers (60, 61) are not formed are removed using laser.

Further, a corrosion-resistant layer (not illustrated in the drawings) made of, for example, Ni/Au, Ni/Pd/Au, Sn or the like may be formed on surfaces of the connection pads (41a, 51a) that are not covered by and exposed from the solder resists (60, 61). Further, a corrosion-resistant layer made of an organic protective film (OSP) may be formed by immersion in a liquid protective material spraying a protective material, or the like. Or, a solder coating layer (not illustrated in the drawings) may be formed.

Through the processes illustrated in FIG. 4A-4J, the wiring board 10 of the present embodiment illustrated in FIG. 1 is completed. As illustrated in FIG. 4J, for example, an electronic component such as the semiconductor element 90 may be connected to the connection pads (41a) of the completed wiring board 10. Similarly, another electronic component (not illustrated in the drawings) may be connected to the connection pads (51a). Further, the wiring board 10 may be connected to an external circuit such as another wiring board via the connection pads (41a, 51a).

Further, the method for manufacturing the wiring board 10 of the present embodiment is not limited to the method described with reference to FIG. 4A-4J. The conditions, processing order and the like of the method may be arbitrarily modified. Further, certain processes may be omitted and other processes may be added.

Figure 5A:
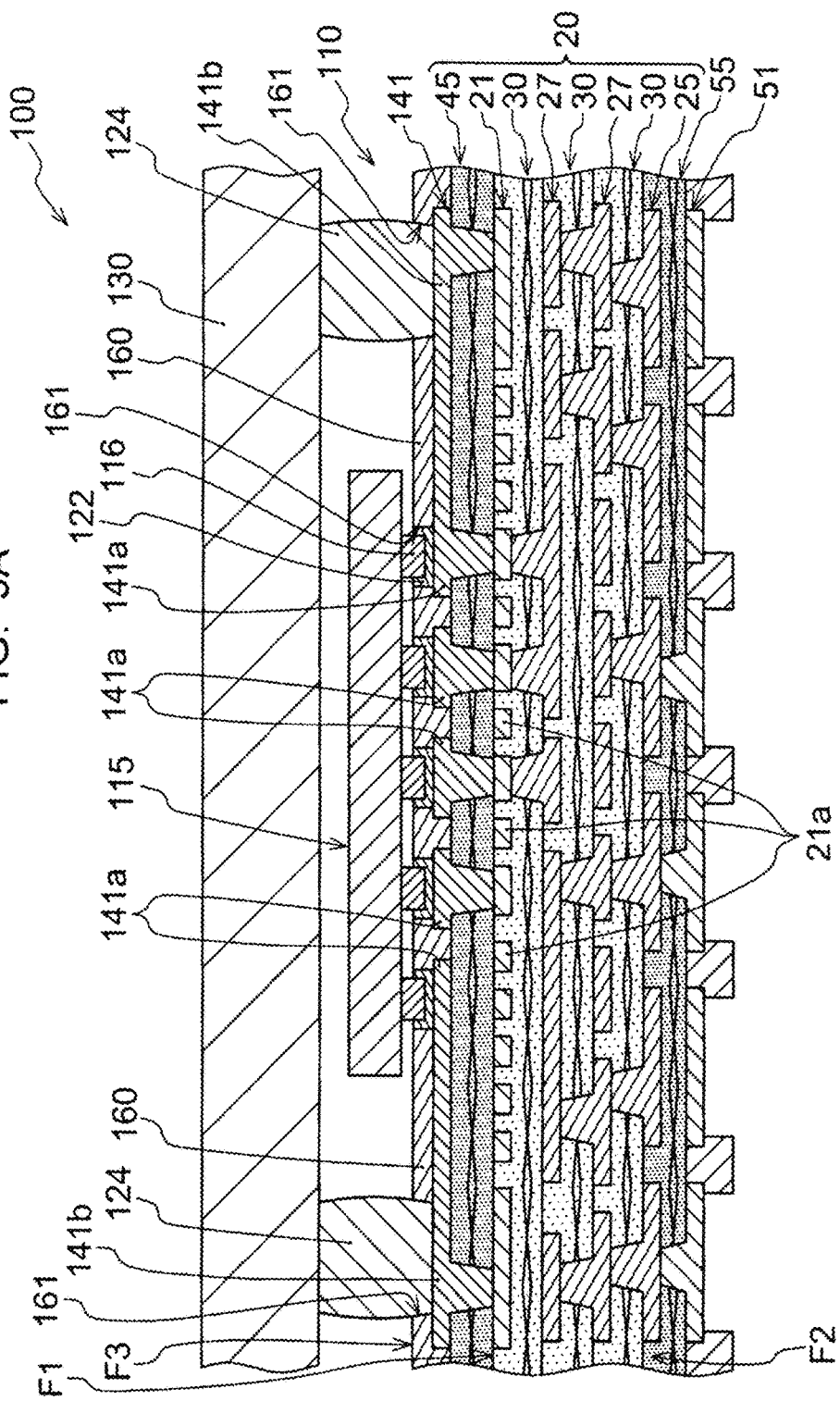
FIG. 5A is a cross-sectional view of an example of a semiconductor package according to an embodiment of the present invention.

Next, a semiconductor package of an embodiment of the present invention is described with reference to the drawings. As illustrated in FIG. 5A, a semiconductor package 100 of the embodiment includes a printed wiring board 110 and a substrate 130. A first semiconductor element 115 is mounted to a surface (F3) of the printed wiring board 110.

The substrate 130 is mounted on the surface (F3) of the printed wiring board 110. Preferably, the printed wiring board of which an example is illustrated in FIG. 1 is used as the printed wiring board 110. FIG. 5A illustrates an example in which the printed wiring board of which an example is illustrated in FIG. 1 is used as the printed wiring board 110. Therefore, most of structural elements of the printed wiring board 110 illustrated in FIG. 5A are the same as those of the printed wiring board 10 illustrated in FIG. 1, and such structural elements are indicated using the same reference numeral symbols and detailed description thereof is omitted. However, the printed wiring board 110 is not limited to the printed wiring board 10 illustrated in FIG. 1, but may incorporate various modifications and variations with respect to the respective structural elements as indicated in the above description of the printed wiring board 10.

As illustrated in FIG. 5A, in the printed wiring board 110, a third conductor layer 141 is formed on the surface (F3), and a solder resist layer 160 is formed on the third conductor layer 141. The solder resist layer 160 has openings 161 at predetermined portions thereof. Connection pads (141a, 141b) that form a portion of the third conductor layer 141 are exposed from the openings 161 of the solder resist layer 160.

The substrate 130 has bumps 124 on a surface on the printed wiring board 110 side. The bumps 124 are connected to the connection pads (141b) that form a portion of the third conductor layer 141 of the printed wiring board 110.

Further, the first semiconductor element 115 is positioned in a space that is between the printed wiring board 110 and the substrate 120 and has a height in accordance with a height of the bumps 124. Further, the first semiconductor element 115 has electrodes 116. The electrodes 116 are connected via a joining material 122 to the connection pads (141a) that form a portion of the third conductor layer 141 of the printed wiring board 110.

The semiconductor package 100 of the present embodiment includes the printed wiring board 110 that is the same as the above-described printed wiring board 10 of the embodiment illustrated in FIG. 1. Therefore, the wiring pattern (21a) is formed in the first conductor layer 21 with the minimum wiring width that is smaller than all the minimum widths of the wiring patterns that are respectively formed in the other conductor layers in the printed wiring board 110. The number of layers of the printed wiring board can be reduced and electrical characteristics of the electrical circuit that is formed in the printed wiring board 110 can be improved. Further, occurrence of unevenness on the surface of the printed wiring board 110 is suppressed. Therefore, reduction in field of mounting the first semiconductor element 115 can be prevented.

The structure and material of the substrate 130 are not particularly limited. Any substrate may be used as the substrate 130, such as a printed wiring board that is formed by an insulating layer made of a resin material and a conductor layer made of a copper foil or the like, a wiring board obtained by forming a conductor film on a surface of an insulating substrate made of an inorganic material such as alumina or aluminum nitride, and a motherboard substrate manufactured using a method described in FIG. 8-13 of International Publication No. WO/2011/122246. The entire contents of this publication are incorporated herein by reference. Further, the first semiconductor element 115 is also not particularly limited. Any semiconductor element, such as a microcomputer, a memory, and an ASIC, can be used as the first semiconductor element 115. The third conductor layer 141 and the solder resist layer 160 can be formed using the same material and method as those for the third conductor layer 41 and the solder resist layer 60 of the above-described printed wiring board 10.

The materials for the joining material 122 and the bumps 124 are also not particularly limited. Any conductive material, preferably, metal such as solder, gold and copper can be used. Further, it is also possible that, without using the joining material 122, the electrodes 116 of the first semiconductor element 115 and the connection pads (141a) are connected by forming inter-metal junctions therebetween by applying heat, pressure and/or vibration.

FIG. 5B illustrates an example in which a space between the printed wiring board 110 and the substrate 130 of the semiconductor package 100 illustrated in FIG. 5A is filled with a mold resin 126. In this way, when the space is filled with the mold resin 126, there are advantages such as that the first semiconductor element 115 is protected from a mechanical stress, and that the behavior of the printed wiring board 110 due to ambient temperature variation is limited, a stress that occurs in a portion connecting to the first semiconductor element 115 is reduced and connection reliability is improved. The material for the mold resin 126 is not particularly limited. However, for example, a material that has a thermal expansion coefficient close to that of the first semiconductor element 115 and has good insulation performance is used. Preferably, as the mold resin 126, a thermosetting epoxy resin containing a suitable amount of filler such as silica is used. A method for filling the space with the mold resin 126 is not particularly limited. For example, the filling may be performed by transfer molding in a mold (not illustrated in the drawings), or by injecting a liquid resin and thereafter applying heat to cure the resin.

Figure 5C:
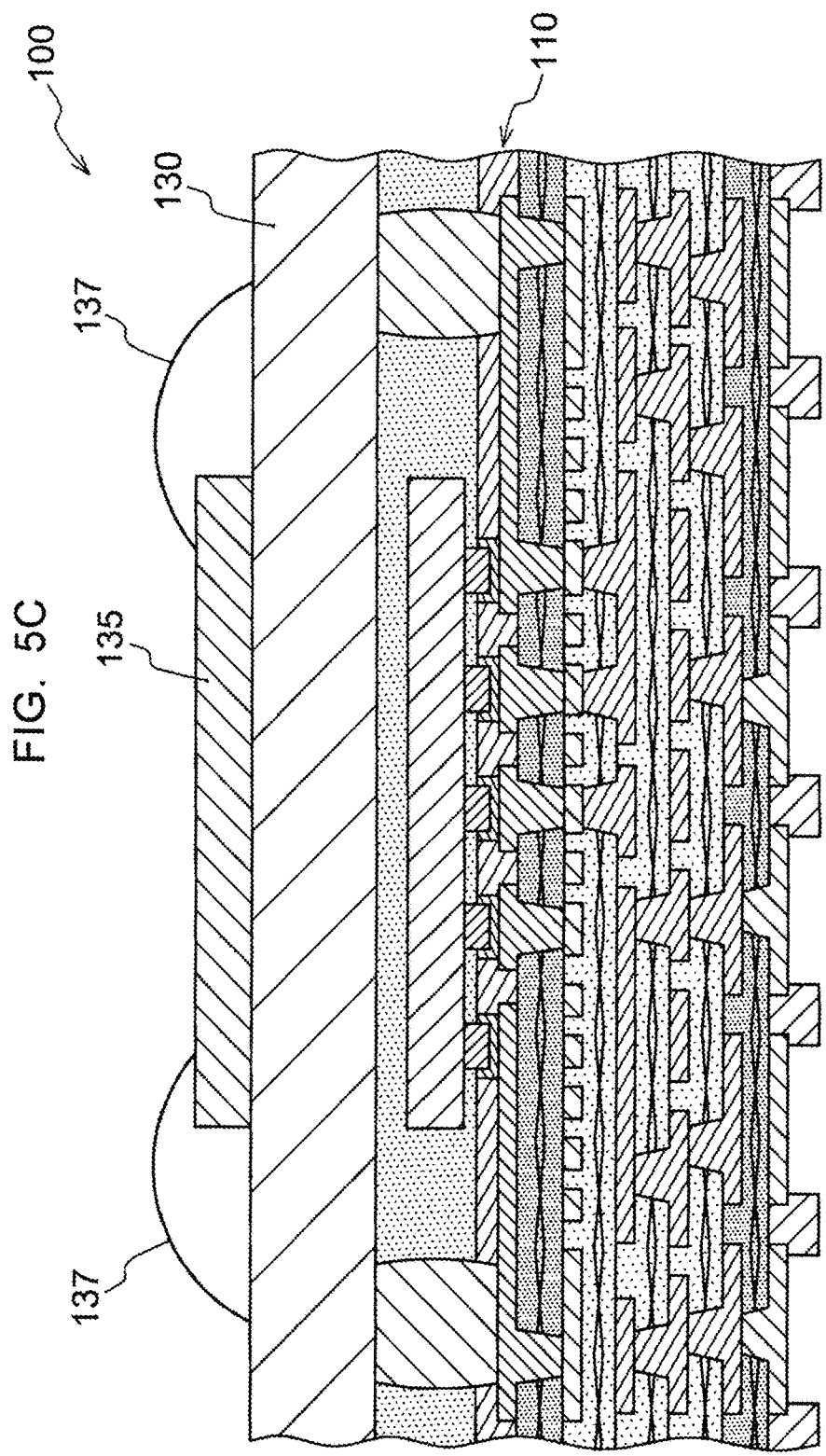
FIG. 5C is a cross-sectional view of yet another example of a semiconductor package according to an embodiment of the present invention.

FIG. 5C illustrates an example in which a second semiconductor element 135 is mounted on the substrate 130 of the semiconductor package 100 illustrated in FIG. 5B. As illustrated in FIG. 5C, electrodes (not illustrated in the drawings) that are provided on one surface of the second semiconductor element 135 are connected to the substrate 130 by a bonding wire 137, or, the connection may be performed using a flip-chip mounting method by inverting the second semiconductor element 135 so that the surface on which the electrodes are provided faces downward. In this way, by making the semiconductor package in a package-on-package structure in which the second semiconductor element 135 is mounted, a size in a plan view can be reduced and a sophisticated semiconductor device can be provided.

Figure 6:
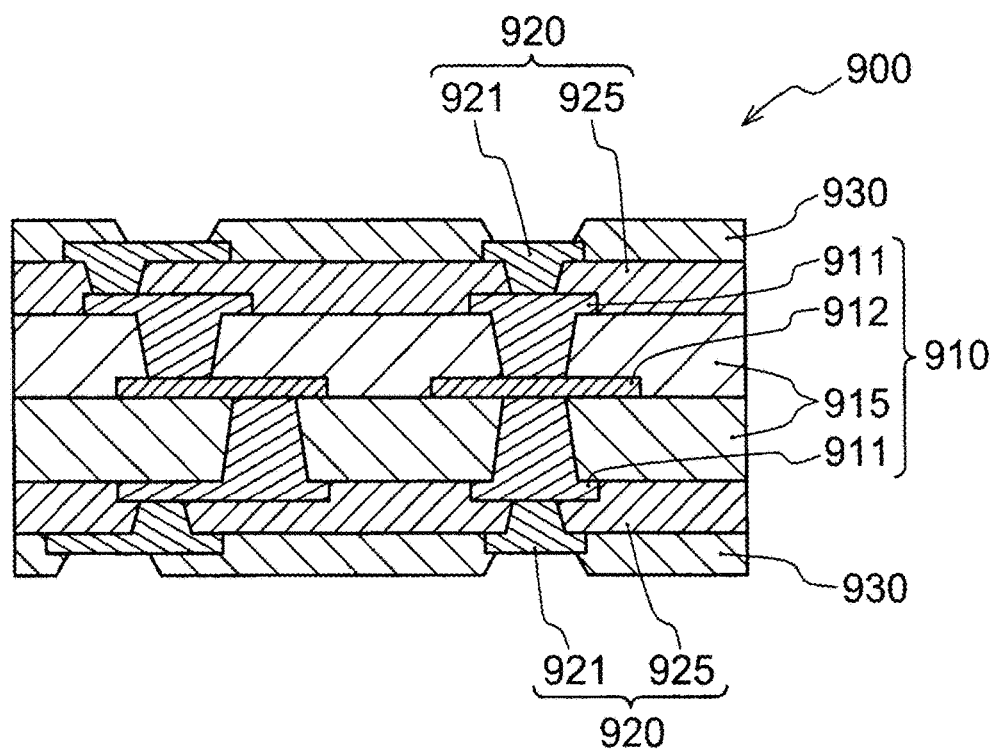
FIG. 6 is a cross-sectional view of a printed wiring board according to the background technology.

As illustrated in FIG. 6, a build-up wiring board 900 may be formed, for example, by laminating a build-up layer 920 that includes a conductor layer 921 and an insulating layer 925 on a surface on each of two sides of a core substrate 910 that includes conductor layers (911, 912) and two insulating layers 915. Further, a solder resist 930 is formed on a predetermined portion of the build-up layer 920.

In the build-up wiring board 900 illustrated in FIG. 6, a large number of connection pads to which an electronic component mounted to the build-up wiring board 900 is connected are formed in a surface-layer conductor layer. Therefore, there is a tendency that wiring patterns that are connected to the electronic component are not formed in the surface-layer conductor layer such as the conductor layer 921, but are formed in a conductor layer immediately below the surface-layer conductor layer, or in a conductor layer that is relatively close to the surface-layer conductor layer among conductor layers of further lower layers. Further, along with progress in mulitpolarization of an electronic component mounted on a printed wiring board, it is possible that the number of the conductor layers required for the formation of the wiring patterns is increased. As a result, it is possible that a wiring length of a wiring connecting between electronic components becomes long, so that good electrical characteristics cannot be obtained and manufacturing cost of the printed wiring board is increased.

A printed wiring board according to an embodiment of the present invention allows the number of layers to be reduced and, as a results, allows manufacturing cost to be reduced and good electrical characteristics to be obtained, and a semiconductor package according to another embodiment of the present invention includes such a printed wiring board.

A printed wiring board according to an embodiment of the present invention includes: a core laminate body that is formed by alternately laminating insulating layers and conductor layers, and has a first conductor layer on a first surface and a second conductor layer on a second surface that is on an opposite of the first surface; a first build-up layer that is provided on the first surface of the core laminate body, and at least includes a first interlayer resin insulating layer and a third conductor layer that is laminated on the first interlayer resin insulating layer; a second build-up layer that is provided on the second surface of the core laminate body, and at least includes a second interlayer resin insulating layer and a fourth conductor layer that is laminated on the second interlayer resin insulating layer; and via conductors that each penetrate through an insulating layer in the core laminate body or interlayer resin insulating layer in the first or second build-up layer, and are each connected to at least one of the conductor layers in the core laminate body and in the first and second build-up layers. The first conductor layer is a conductor layer that is formed such that, on one surface of the first conductor layer, the via conductors each having an end surface on the one surface side smaller than an end surface on an opposite side of the one surface side are formed in contact with the one surface, and, on the other surface of the first conductor layer, the via conductors each having an end surface on the other surface side smaller than an end surface on an opposite side of the other surface side are formed in contact with the other surface. The first conductor layer is embedded in the insulating layer on the first surface of the core laminate body, and the one surface of the first conductor layer is exposed from the insulating layer. The second conductor layer is formed on the insulating layer on the second surface of the core laminate body. A minimum width of a wiring pattern that is formed in the first conductor layer is the smallest among minimum widths of wiring patterns that respectively formed in the conductor layers that form the core laminate body, the conductor layer that forms the first build-up layer and the conductor layer that forms the second build-up layer.

Further, a semiconductor package according to another embodiment of the present invention includes a printed wiring board and a substrate. A first semiconductor element is mounted on a surface of the printed wiring board. The substrate is mounted on the surface of the printed wiring board. The printed wiring board includes: a core laminate body that is formed by alternately laminating insulating layers and conductor layers, and has a first conductor layer on a first surface and a second conductor layer on a second surface that is on an opposite of the first surface; a first build-up layer that is provided on the first surface of the core laminate body, and at least includes a first interlayer resin insulating layer and a third conductor layer that is laminated on the first interlayer resin insulating layer; a second build-up layer that is provided on the second surface of the core laminate body, and at least includes a second interlayer resin insulating layer and a fourth conductor layer that is laminated on the second interlayer resin insulating layer; via conductors that each penetrate through an insulating layer in the core laminate body or interlayer resin insulating layer in the first or second build-up layer, and are each connected to at least one of the conductor layers in the core laminate body and in the first and second build-up layers; and a solder resist layer that is formed on the first build-up layer. The first conductor layer is a conductor layer that is formed such that, on one surface of the first conductor layer, the via conductors each having an end surface on the one surface side smaller than an end surface on an opposite side of the one surface side are formed in contact with the one surface, and, on the other surface of the first conductor layer, the via conductors each having an end surface on the other surface side smaller than an end surface on an opposite side of the other surface side are formed in contact with the other surface. The first conductor layer is embedded in the insulating layer on the first surface of the core laminate body, and the one surface of the first conductor layer is exposed from the insulating layer. The second conductor layer is formed on the insulating layer on the second surface of the core laminate body. A minimum width of a wiring pattern that is formed in the first conductor layer is the smallest among minimum widths of wiring patterns that respectively formed in the conductor layers that form the core laminate body, the conductor layer that forms the first build-up layer and the conductor layer that forms the second build-up layer. The substrate has bumps on surface on the printed wiring board side. The bumps are connected to a surface-layer conductor layer of the first build-up layer that is exposed from openings that are provided in the solder resist layer.

According to an embodiment of the present invention, the wiring pattern of the first conductor layer is most finely formed among the wiring patterns that are formed in the conductor layers in the printed wiring board. Therefore, it is possible that the number of the layers of the printed wiring board can be reduced. Further, it is possible that the wirings that are connected to an electronic component mounted on the surface of the printed wiring board can be shortened. Therefore, it is possible that the manufacturing cost of the printed wiring board is reduced, and electrical characteristics of an electrical circuit that is formed in the printed wiring board can be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a core laminate body comprising a plurality of insulating layers, a plurality of conductor layers including a first conductor layer and a second conductor layer, and a plurality of via conductors having end surfaces formed smaller than opposite end surfaces and connected to the first conductor layer at the end surfaces formed smaller than the opposite end surfaces;
    a first build-up layer formed on a first surface of the core laminate body and comprising a first interlayer resin insulating layer, a third conductor layer laminated on the first interlayer resin insulating layer and a plurality of first via conductors having end surfaces formed smaller than opposite end surfaces and connected to the first conductor layer of the core laminate body at the end surfaces formed smaller than the opposite end surfaces; and
    a second build-up layer formed on a second surface of the core laminate body and comprising a second interlayer resin insulating layer and a fourth conductor layer laminated on the second interlayer resin insulating layer, wherein the first conductor layer is embedded such that the first conductor layer has an exposed surface on the first surface of the core laminate body and that the exposed surface of the first conductor layer is in contact with the first via conductors of the first build-up layer at the end surfaces formed smaller than the opposite end surfaces, the second conductor layer is formed such that the second conductor layer is on the second surface of the core laminate body, each of the conductor layers in the core laminated body, the third conductor layer in the first build-up layer and the fourth conductor layer in the second build-up layer have a wiring pattern such that the wiring pattern of the first conductor layer has a minimum width which is the smallest among minimum widths of the wiring patterns of the conductor layers formed in the core laminate body and the third conductor layer in the first build-up layer and the fourth conductor layer in the second build-up layer, the plurality of via conductors formed in the core laminate body is tapering toward the first conductor layer such that the end surfaces of the via conductors are connected to the first conductor layer, and the plurality of first via conductors formed in the first interlayer resin insulating layer of the first build-up layer is tapering toward the first conductor layer such that the end surfaces of the first via conductors are connected to the first conductor layer.

2. The printed wiring board according to claim 1, wherein each of the insulating layers in the core laminate body comprises a prepreg material comprising a resin material and an inorganic fiber core material impregnated in the resin material.

3. The printed wiring board according to claim 1, wherein the first build-up layer further comprises a plurality of interlayer resin insulating layers and a plurality of conductor layers such that the interlayer resin insulating layers and the conductor layers are alternately laminated, and the second build-up layer further comprises a plurality of interlayer resin insulating layers and a plurality of conductor layers such that the interlayer resin insulating layers and the conductor layers are alternately laminated.

4. The printed wiring board according to claim 1, wherein the first interlayer resin insulating layer comprises a prepreg material comprising a resin material and an inorganic fiber core material impregnated in the resin material, and the second interlayer resin insulating layer comprises a prepreg material comprising a resin material and an inorganic fiber core material impregnated in the resin material.

5. The printed wiring board according to claim 1, wherein the first interlayer resin insulating layer comprises a resin material and inorganic filler in an amount of 30 wt % to 70 wt % with respect to the first interlayer resin insulating layer such that the resin material does not contain an inorganic fiber core material, and the second interlayer resin insulating layer comprises a resin material and inorganic filler in an amount of 30 wt % to 70 wt % with respect to the second interlayer resin insulating layer such that the resin material does not contain an inorganic fiber core material.

6. The printed wiring board according to claim 1, wherein the core laminate body includes a stack via structure comprising the plurality of via conductors and a second plurality of via conductors laminated on the plurality of via conductors, respectively.

7. The printed wiring board according to claim 1, further comprising:
a stack via structure comprising a plurality of via conductors and formed through the first build-up layer, core laminate body and second build-up structure such that the stack via structure is connecting an outermost conductor layer in the first build-up layer and an outermost conductor layer in the second build-up layer,
wherein the stack via structure includes the via conductors in the core laminate body and the first via conductors in the first build-up layer.

8. The printed wiring board according to claim 1, further comprising:
a semiconductor component mounted on a surface of the first build-up layer.

9. The printed wiring board according to claim 1, further comprising:
a plurality of second via conductors formed in the second build-up layer such that each of the second via conductors has a shape which becomes smaller toward the second surface of the core laminate body.

10. The printed wiring board according to claim 2, wherein the first interlayer resin insulating layer comprises a prepreg material comprising a resin material and an inorganic fiber core material impregnated in the resin material, and the second interlayer resin insulating layer comprises a prepreg material comprising a resin material and an inorganic fiber core material impregnated in the resin material.

11. The printed wiring board according to claim 2, wherein the first interlayer resin insulating layer comprises a resin material and inorganic filler in an amount of 30 wt % to 70 wt % with respect to the first interlayer resin insulating layer such that the resin material does not contain an inorganic fiber core material, and the second interlayer resin insulating layer comprises a resin material and inorganic filler in an amount of 30 wt % to 70 wt % with respect to the second interlayer resin insulating layer such that the resin material does not contain an inorganic fiber core material.

12. The printed wiring board according to claim 2, wherein the core laminate body includes a stack via structure comprising the plurality of via conductors and a second plurality of via conductors laminated on the plurality of via conductors, respectively.

13. The printed wiring board according to claim 3, wherein each of the insulating layers in the core laminate body comprises a prepreg material comprising a resin material and an inorganic fiber core material impregnated in the resin material.

14. The printed wiring board according to claim 4, wherein the first build-up layer comprises a plurality of interlayer resin insulating layers and a plurality of conductor layers such that the interlayer resin insulating layers and the conductor layers are alternately laminated, and the second build-up layer comprises a plurality of interlayer resin insulating layers and a plurality of conductor layers such that the interlayer resin insulating layers and the conductor layers are alternately laminated.

15. A semiconductor package, comprising:
a printed wiring board;
a first semiconductor component mounted on a surface of the printed wiring board; and
a substrate mounted on the surface of the printed wiring board and having a bump structure such that the substrate is positioned on the printed wring board through the bump structure, wherein the printed wiring board comprises a core laminate body comprising a plurality of insulating layers, a plurality of conductor layers including a first conductor layer and a second conductor layer, and a plurality of via conductors having end surfaces formed smaller than opposite end surfaces and connected to the first conductor layer at the end surfaces formed smaller than the opposite end surfaces, a first build-up layer formed on a first surface of the core laminate body and comprising a first interlayer resin insulating layer, a third conductor layer laminated on the first interlayer resin insulating layer, and a plurality of first via conductors having end surfaces formed smaller than opposite end surfaces and connected to the first conductor layer of the core laminate body at the end surfaces formed smaller than the opposite end surfaces, a second build-up layer formed on a second surface of the core laminate body and comprising a second interlayer resin insulating layer and a fourth conductor layer laminated on the second interlayer resin insulating layer, and a solder resist layer formed on a surface of the first build-up layer and having an opening structure such that the bump structure is connected to an outermost conductor layer of the first build-up layer through the opening structure, the first conductor layer is embedded such that the first conductor layer has an exposed surface on the first surface of the core laminate body and that the exposed surface of the first conductor layer is in contact with the first via conductors of the first build-up layer at the end surfaces formed smaller than the opposite end surfaces, the second conductor layer is formed such that the second conductor layer is on the second surface of the core laminate body, each of the conductor layers in the core laminated body, the third conductor layer in the first build-up layer and the fourth conductor layer in the second build-up layer have a wiring pattern such that the wiring pattern of the first conductor layer has a minimum width which is the smallest among minimum widths of the wiring patterns of the conductor layers formed in the core laminate body and the third conductor layer in the first build-up layer and the fourth conductor layer in the second build-up layer, the plurality of via conductors formed in the core laminate body is tapering toward the first conductor layer such that the end surfaces of the via conductors are connected to the first conductor layer, and the plurality of first via conductors formed in the first interlayer resin insulating layer of the first build-up layer is tapering toward the first conductor layer such that the end surfaces of the first via conductors are connected to the first conductor layer.

16. The semiconductor package according to claim 15, further comprising:
a mold resin body filling a space formed between the substrate and the printed wiring board,
wherein the first semiconductor component is positioned in the space formed between the substrate and the printed wiring board such that the first semiconductor component is sealed in the mold resin body.

17. The semiconductor package according to claim 15, further comprising:
a second semiconductor component mounted on the substrate.

18. The semiconductor package according to claim 15, wherein the printed wiring board comprises a stack via structure comprising a plurality of via conductors and formed through the first build-up layer, core laminate body and second build-up structure such that the stack via structure is connecting an outermost conductor layer in the first build-up layer and an outermost conductor layer in the second build-up layer, and the stack via structure includes the via conductors in the core laminate body and the first via conductors in the first build-up layer.

19. The semiconductor package according to claim 16, further comprising:
a second semiconductor component mounted on the substrate.

20. A semiconductor package, comprising:
a printed wiring board;
a first semiconductor component mounted on a surface of the printed wiring board; and
a substrate mounted on the surface of the printed wiring board and having a bump structure such that the substrate is positioned on the printed wring board through the bump structure,
wherein the printed wiring board comprises a core laminate body comprising a plurality of insulating layers, a plurality of conductor layers including a first conductor layer and a second conductor layer, and a plurality of via conductors having end surfaces formed smaller than opposite end surfaces and connected to the first conductor layer at the end surfaces formed smaller than the opposite end surfaces, a first build-up layer formed on a first surface of the core laminate body and comprising a first interlayer resin insulating layer, a third conductor layer laminated on the first interlayer resin insulating layer, and a plurality of first via conductors having end surfaces formed smaller than opposite end surfaces and connected to the first conductor layer of the core laminate body at the end surfaces formed smaller than the opposite end surfaces, a second build-up layer formed on a second surface of the core laminate body and comprising a second interlayer resin insulating layer and a fourth conductor layer laminated on the second interlayer resin insulating layer, and a solder resist layer formed on a surface of the first build-up layer and having an opening structure such that the bump structure is connected to an outermost conductor layer of the first build-up layer through the opening structure, the first conductor layer is embedded such that the first conductor layer has an exposed surface on the first surface of the core laminate body and that the exposed surface of the first conductor layer is in contact with the first via conductors of the first build-up layer at the end surfaces formed smaller than the opposite end surfaces, the second conductor layer is formed such that the second conductor layer is on the second surface of the core laminate body, each of the conductor layers in the core laminated body, the third conductor layer in the first build-up layer and the fourth conductor layer in the second build-up layer have a wiring pattern such that the wiring pattern of the first conductor layer has a minimum width which is the smallest among minimum widths of the wiring patterns of the conductor layers formed in the core laminate body and the third conductor layer in the first build-up layer and the fourth conductor layer in the second build-up layer, the printed wiring board comprises a stack via structure comprising a plurality of via conductors and formed through the first build-up layer, core laminate body and second build-up structure such that the stack via structure is connecting an outermost conductor layer in the first build-up layer and an outermost conductor layer in the second build-up layer, and the stack via structure includes the via conductors.

* * * * *